(12) United States Patent
Murasaki

(10) Patent No.: US 10,845,423 B2
(45) Date of Patent: Nov. 24, 2020

(54) POWER STORAGE MEMBER MONITORING DEVICE, POWER STORAGE APPARATUS, AND POWER STORAGE MEMBER MONITORING METHOD

(71) Applicant: Sony Corporation, Tokyo (JP)

(72) Inventor: Masashi Murasaki, Kanagawa (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 98 days.

(21) Appl. No.: 14/534,420

(22) Filed: Nov. 6, 2014

(65) Prior Publication Data

US 2015/0137823 A1    May 21, 2015

(30) Foreign Application Priority Data

Nov. 21, 2013  (JP) ................. 2013-241179

(51) Int. Cl.
| | | |
|---|---|---|
| *G01R 31/396* | (2019.01) | |
| *H02J 7/00* | (2006.01) | |
| *G01R 31/3835* | (2019.01) | |
| *G01R 31/389* | (2019.01) | |
| *G01R 19/165* | (2006.01) | |

(52) U.S. Cl.
CPC ......... *G01R 31/396* (2019.01); *G01R 31/389* (2019.01); *G01R 31/3835* (2019.01); *H02J 7/0021* (2013.01); *H02J 7/0047* (2013.01); *G01R 19/16542* (2013.01); *H02J 7/0013* (2013.01); *H02J 7/0014* (2013.01); *H02J 7/0016* (2013.01); *H02J 7/0018* (2013.01); *H02J 7/0019* (2013.01)

(58) Field of Classification Search
CPC .............. G01R 31/362; G01R 31/3658; G01R 31/3662; G01R 19/16542; G01R 9/16542; G01R 31/3835; G01R 31/396; G01R 31/389; H02J 7/0021; H02J 7/0018; H02J 7/0013; H02J 7/0014; H02J 7/0019; H02J 7/0016; H02J 7/0047
USPC ......... 324/430; 320/116, 118, 119, 120, 122, 320/134, 136, 162
See application file for complete search history.

(56) References Cited

U.S. PATENT DOCUMENTS

| | | | |
|---|---|---|---|
| 9,097,774 B2 * | 8/2015 | White ................. | H01M 10/441 |
| 2012/0038322 A1 | 2/2012 | Moorhead et al. | |

(Continued)

FOREIGN PATENT DOCUMENTS

| | | |
|---|---|---|
| EP | 1 814 206 | 8/2007 |
| JP | 2002-042906 | 2/2002 |

(Continued)

OTHER PUBLICATIONS

European Office Action dated Dec. 3, 2018 in corresponding European Application No. 14 193 595.7.

(Continued)

*Primary Examiner* — Richard Isla
*Assistant Examiner* — Manuel Hernandez
(74) *Attorney, Agent, or Firm* — K&L Gates LLP

(57) ABSTRACT

A power storage member monitoring device of the present disclosure includes a circuit that designates a monitor target power storage member based on results of voltage measurement carried out more than once on each of series-connected power storage blocks, each of the power storage blocks including at least one power storage member.

16 Claims, 21 Drawing Sheets

(56) References Cited

U.S. PATENT DOCUMENTS

| | | | |
|---|---|---|---|
| 2012/0153961 A1* | 6/2012 | Kobayashi | G01R 31/362 |
| | | | 324/434 |
| 2013/0065093 A1 | 3/2013 | White et al. | |
| 2014/0368206 A1* | 12/2014 | Aoshima | G01R 31/3679 |
| | | | 324/426 |
| 2015/0130404 A1* | 5/2015 | Luo | H02J 7/0016 |
| | | | 320/107 |

FOREIGN PATENT DOCUMENTS

| JP | 2012-090392 | 5/2012 |
|---|---|---|
| JP | 2013084353 | 4/2015 |

OTHER PUBLICATIONS

Extended European Search Report dated Apr. 22, 2015 in corresponding European Application No. 14 193 595.7.

\* cited by examiner

POWER STORAGE MEMBER MONITORING DEVICE, POWER STORAGE APPARATUS, AND POWER STORAGE MEMBER MONITORING METHOD

CROSS REFERENCES TO RELATED APPLICATIONS

The present application claims priority to Japanese Priority Patent Application JP 2013-241179 filed in the Japan Patent Office on Nov. 21, 2013, the entire content of which is hereby incorporated by reference.

BACKGROUND

The present disclosure relates to a power storage member monitoring device, a power storage apparatus, and a power storage member monitoring method. More particularly, the present disclosure relates to a power storage member monitoring device that monitors power storage members, a power storage apparatus, and a power storage member monitoring method.

There have been techniques suggested for monitoring the states of battery cells. For example, Patent Literature 1 discloses a technique by which cell voltages of battery cells are detected, and the battery cell having the highest cell voltage and the battery cell having the lowest cell voltage are monitored.

CITATION LIST

Patent Literature

[PTL 1]
JP 2012-90392 A

SUMMARY

Technical Problem

If monitor target power storage members are frequently switched, accurate monitoring of a monitor target might become difficult.

The present disclosure is to provide a power storage member monitoring device, a power storage apparatus, and a power storage member monitoring method that increase the accuracy of monitoring of a power storage member.

Solution to Problem

A power storage member monitoring device according to the present disclosure includes a circuit that designates a monitor target power storage member based on results of voltage measurement carried out more than once on each of series-connected power storage blocks, each of the power storage blocks including at least one power storage member.

Here, the monitor target power storage member is a power storage member to be monitored by the power storage member monitoring device among the power storage members included in the power storage blocks.

The circuit may designate the monitor target power storage member that is a power storage member of a power storage block having the lowest voltage at a relatively high frequency among the power storage blocks.

In this case, the circuit may designate the monitor target power storage member that is a power storage member of a power storage block having the lowest voltage a relatively large number of times among the power storage blocks.

In this case, the circuit may designate the monitor target power storage member that is a power storage member of a power storage block having the lowest voltage a larger number of times than a threshold value.

In this case, the circuit may designate the monitor target power storage member that is a power storage member of a second power storage block, the second power storage block having the lowest voltage a larger number of times than a second threshold value and satisfying a temperature condition, the second threshold value being smaller than a first threshold value.

In this case, if the second power storage block does not exist, the circuit may designate the monitor target power storage member that is a power storage member of a first power storage block having the lowest voltage a larger number of times than the first threshold value.

The circuit may also designate monitor target power storage members that are a power storage member of the first power storage block having the lowest voltage a larger number of times than the first threshold value, and a power storage member of the second power storage block.

The temperature condition may include having the lowest temperature.

In this case, the temperature condition may include having a lower temperature than a threshold temperature.

The circuit may designate the monitor target power storage member that is a power storage member of a power storage block having the lowest voltage a relatively large number of times in a certain period of time every time the certain period of time has passed.

In this case, when a discharge capacity exceeds a threshold capacity, the circuit may designate the monitor target power storage member that is a power storage member of the power storage block having the lowest voltage the largest number of times in the certain period of time, and, when the discharge capacity is equal to or lower than the threshold capacity, the circuit may designate the monitor target power storage member that is a power storage member of a power storage block having the lowest voltage a larger number of times than a threshold value.

The circuit may designate the monitor target power storage member based on the results of the voltage measurement carried out more than once, the results being acquired through communication.

The circuit may designate the monitor target power storage member based on voltages of the respective power storage blocks at a time of discharging.

The circuit may calculate an internal resistance of the monitor target power storage member.

A power storage apparatus according to the present disclosure includes: series-connected power storage blocks each including at least one power storage member; and a power storage member monitoring device including a circuit that designates a monitor target power storage member based on results of voltage measurement carried out more than once on each of the power storage blocks.

A power storage member monitoring method according to the present disclosure includes designating a monitor target power storage member based on results of voltage measurement carried out more than once on each of series-connected power storage blocks, each of the power storage blocks including at least one power storage member.

Advantageous Effects of Invention

According to the present disclosure, the accuracy of monitoring of a power storage member can be increased.

Additional features and advantages are described herein, and will be apparent from the following Detailed Description and the figures.

DETAILED DESCRIPTION

Figure 1:
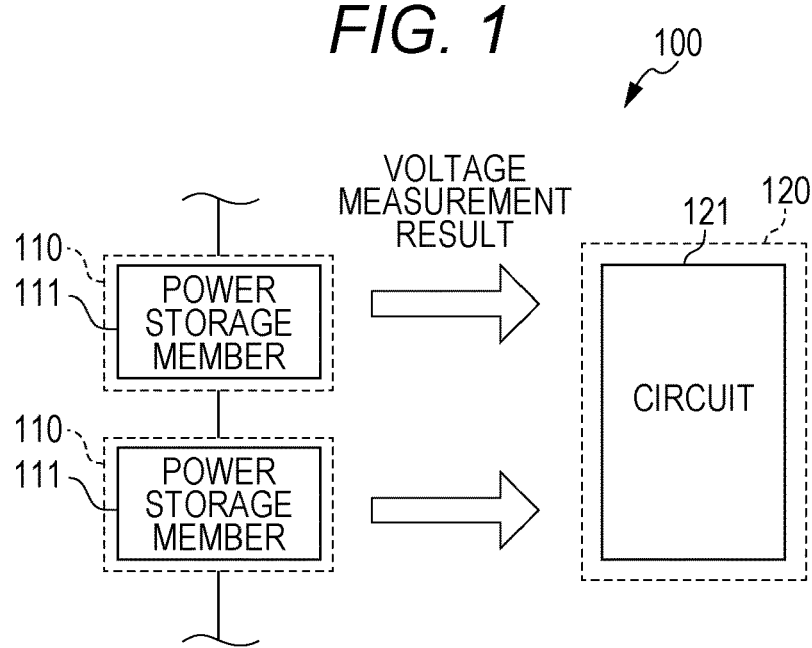
FIG. 1 is a diagram schematically showing an example structure of a power storage member monitoring device according to a first embodiment of the present disclosure.

The following is a description of preferred embodiments for carrying out the present disclosure, with reference to the accompanying drawings. The embodiments described below are typical examples of embodiments of the present disclosure, and the scope of the present disclosure is not narrowed by those embodiments. In the respective embodiments, like components are denoted by like reference numerals, and explanation of them will not be repeated more than once. Explanation will be made in the following order.

1. First Embodiment
(An example of a power storage apparatus that designates a monitor target power storage member based on results of voltage measurement carried out more than once)
2. First Modification of the First Embodiment
(An example of a power storage apparatus that has cells in place of power storage members)
3. Second Modification of the First Embodiment
(An example of a power storage apparatus that calculates an internal resistance of a monitor target cell)
4. Second Embodiment
(An example of a power storage apparatus that designates a monitor target cell that is a cell of a power storage block having the lowest voltage at a relatively high frequency)

5. Third Embodiment
(An example of a power storage apparatus that designates a monitor target cell that is a cell of a power storage block having the lowest voltage a relatively large number of times)
6. First Modification of the Third Embodiment
(An example of a power storage apparatus that designates a monitor target cell that is a cell of a power storage block having the lowest voltage a larger number of times than a threshold value)
7. Second Modification of the Third Embodiment
(An example of a power storage apparatus that determines the cell number of a monitor target cell based on the threshold value for the number of times the lowest voltage is observed)
8. Third Modification of the Third Embodiment
(An example of a power storage apparatus that preferentially designates a monitor target cell that is a cell of a power storage block that has the lowest voltage a larger number of times than a second threshold value and satisfies temperature conditions)
9. Fourth Modification of the Third Embodiment
(An example of a power storage apparatus in which the temperature conditions are that the lowest temperature is observed, and the lowest temperature is lower than a threshold temperature)
10. Fifth Modification of the Third Embodiment
(An example of a power storage apparatus that designates monitor target cells that are a cell of a power storage block exceeding a first threshold value, and a cell that exceeds a second threshold value and satisfies temperature conditions)
11. Sixth Modification of the Third Embodiment
(An example of a power storage apparatus that designates a monitor target cell that is a cell of a power storage block having the lowest voltage a relatively large number of times in a certain period of time)
12. Seventh Modification of the Third Embodiment
(An example of a power storage apparatus that selects a method of designating a monitor target cell in accordance with discharge capacity)
13. Fourth Embodiment
(An example of a power storage apparatus that designates a monitor target cell based on results of voltage measurement carried out at time of discharging)
14. Fifth Embodiment
(An example of a power storage apparatus that acquires voltage measurement results through communication)
15. First Modification of the Fifth Embodiment
(An example of a power storage apparatus that transmits results of cell voltage measurement to the circuit side)

1. First Embodiment

Example Structure of an Apparatus

FIG. 1 is a diagram schematically showing an example structure of a power storage apparatus 100 of this embodiment. As shown in FIG. 1, the power storage apparatus 100 includes power storage blocks 110 and a power storage member monitoring device 120.

[Power Storage Blocks 110]

As shown in FIG. 1, the power storage apparatus 100 includes the power storage blocks 110 that are connected in series. Each of the power storage blocks 110 has a power storage member 111 as a block unit. That is, each of the power storage blocks 110 includes at least one power storage member 111. The power storage members 111 can be charged and discharged. Specifically, the power storage members 111 can store energy supplied from a power source or the like (not shown) at a time of charging, and supply the stored energy to a load or the like (not shown) at a time of discharging. The power storage members 111 of the respective power storage blocks 110 may be uniform in terms of features such as number, type, connection state, and specification, or may differ from one another such features. In the power storage apparatus 100, groups of series-connected power storage blocks 110 may be connected in parallel.

The power storage members 111 are not limited to any particular type, and may be secondary batteries or cells such as lithium-ion secondary batteries, or electrical double layer capacitors or the like. The present disclosure can be effectively applied to secondary batteries having flat discharge characteristics, such as lithium-ion secondary batteries containing olivine iron phosphate as the cathode material.

[Power Storage Member Monitoring Device 120]
[Circuit 121]

As shown in FIG. 1, the power storage member monitoring device 120 includes a circuit 121. The circuit 121 is designed to designate a monitor target power storage member based on results of voltage measurement carried out more than once on each of the respective power storage blocks 110. In other words, the circuit 121 is designed not to designate the monitor target power storage member from a result of voltage measurement carried out only once on each of the respective power storage blocks 110. Designating the monitor target power storage member may be maintaining the current monitor target power storage member or switching to a new monitor target power storage member. Voltage of each power storage block 110 may be measured with a voltage-measuring electronic device (not shown) that is connected to the power storage blocks 110.

The power storage member monitoring device 120 is designed to monitor the monitor target power storage member. The circuit 121 may monitor the monitor target power storage member. The monitor target power storage member may be monitored by monitoring predetermined monitor items indicating a degradation level of the monitor target power storage member. The monitor items may be monitored by calculating parameters that are the monitor items based on results of measurement carried out on predetermined measurement items of the monitor target power storage member. The forms of the parameters are not particularly limited. The parameters may include an internal resistance of the monitor target power storage member calculated from results of voltage and current measurement, and a remaining battery level calculated through voltage correction, and the like.

The circuit 121 is not limited to any specific form. The circuit 121 may be included in an electronic device such as a microcomputer. The circuit 121 may include an electronic circuit. The electronic circuit may include a digital circuit. The circuit 121 may include a processor such as a CPU (Central Processing Unit), and storage devices such as a RAM (Random Access Memory) and a ROM (Read Only Memory). The ROM may store a power storage member monitoring program and data for designating and monitoring a monitor target power storage member. The circuit 121 may realize a monitor target power storage member designating/monitoring function, with the processor executing the power storage member monitoring program stored in the ROM. The ROM is an example of a computer-readable storage medium that stores the power storage member monitoring program. The RAM may be used as a work area of the processor or the like. However, the circuit 121 is not limited to the above described configurations.

[Example Operation of the Apparatus]

Figure 2:
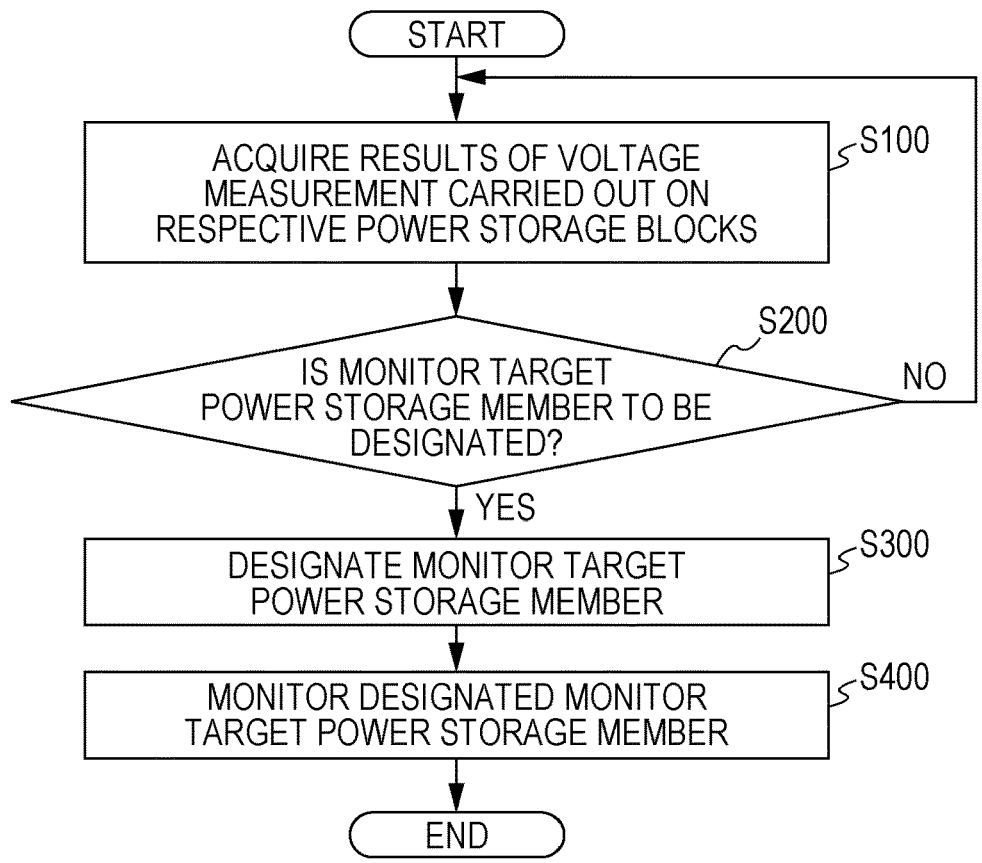
FIG. 2 is a flowchart showing an example operation of the power storage member monitoring device according to the first embodiment of the present disclosure.

FIG. 2 is a flowchart showing an example operation of the power storage apparatus 100 of this embodiment. The example operation shown in FIG. 2 is an embodiment of a power storage member monitoring method according to the present disclosure. However, a power storage member monitoring method according to the present disclosure may be embodied with a structure other than the power storage apparatus 100.

As shown in FIG. 2, in step 100 (S100), the circuit 121 first acquires results of voltage measurement carried out on each of the power storage blocks 110.

In step 200 (S200), the circuit 121 determines whether to designate a monitor target power storage member in accordance with criteria based on results of voltage measurement carried out more than once. In step 200 (S200), a check is substantially made to determine whether a power storage member that satisfies the conditions for a monitor target power storage member exists based on results of voltage measurement carried out more than once. In a case where a positive determination result is obtained in step 200 (S200), the operation moves on to step 300 (S300). In a case where a negative determination result is obtained in step 200 (S200), the operation returns to step 100 (S100) to acquire results of the next voltage measurement. In a case where results of voltage measurement carried out more than once are not acquired, the determination result of step 200 (S200) is also negative.

In step 300 (S300), the circuit 121 designates a monitor target power storage member. The circuit 121 may also store the identification information of the designated monitor target power storage member into the storage area of the circuit 121 or the storage area of an external storage device that can be read by the circuit 121.

In step 400 (S400), the circuit 121 monitors the monitor target power storage member designated in step 300 (S300).

With the power storage apparatus 100 of this embodiment, a monitor target power storage member is designated based on results of voltage measurement carried out more than once, so that frequent switching of monitor target power storage members can be prevented, and accuracy in monitoring of a monitor target power storage member can be increased. Here, the monitoring of a monitor target power storage member is preferably performed for a certain period of time, so as to obtain an accurate monitoring result. Specifically, if the data for calculating the parameters that are the monitor items are more than one piece of data accumulated over a certain period of time, the parameters can be accurately calculated. In a case where a monitor target power storage member is designated based on a result of voltage measurement carried out only once, on the other hand, monitor target power storage members might be changed in a short time due to a variation in voltage measurement. In this case, it is not possible to keep track of the monitor items of one monitor target power storage member, and therefore, the monitoring results will show a low degree of accuracy. Also, since it is considered that variation in degradation level among the power storage members 111 becomes wider not quickly but gradually, it is difficult to accurately identify a power storage member 111 having a high degree of degradation only from a result of voltage measurement carried out once. According to this embodiment, the current monitor target power storage member can continue to be monitored during voltage measurement being carried out more than once, and measurement results that correctly reflect degradation levels and are sufficient in number for designating a new monitor target power storage member are obtained. Thus, monitoring with high accuracy and high certainty can be performed.

2. First Modification of the First Embodiment

First Example Structure

Figure 3:
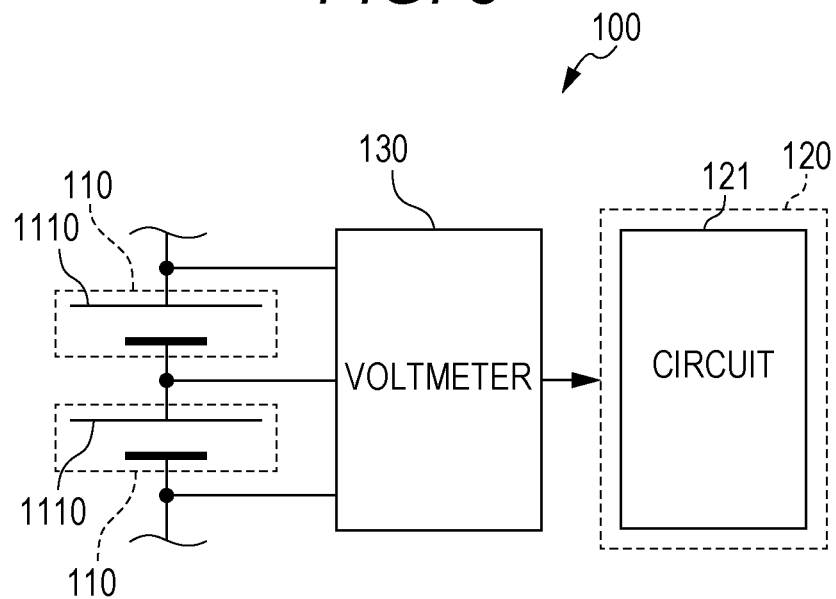
FIG. 3 is a diagram schematically showing a first example structure of a power storage member monitoring device according to a first modification of the first embodiment of the present disclosure.

FIG. 3 is a diagram schematically showing a first example structure of a power storage apparatus 100 of this modification. The power storage apparatus 100 shown in FIG. 3 has a more particular structure than that of the power storage apparatus 100 shown in FIG. 1.

Specifically, in the power storage apparatus 100 of this modification, each power storage block 110 includes a cell 1110 as an example of a power storage member 111. That is, in this modification, an assembled battery is formed with the respective power storage blocks 110. Each power storage block 110 may include one cell 1110 as shown in FIG. 3, but the configuration is not limited to that. The power storage apparatus 100 in FIG. 3 also includes a voltmeter 130. The voltmeter 130 is placed between the power storage blocks 110 and the circuit 121. The voltmeter 130 is designed to measure voltages of the respective power storage blocks 110. The voltmeter 130 is also designed to output results of voltage measurement carried out on the respective power storage blocks 110 to the circuit 121. The voltmeter 130 may be designed to output results of voltage measurement carried out on the power storage blocks 110 simultaneously or sequentially to the circuit 121. The voltmeter 130 is not limited to any specific form. The voltmeter 130 may be formed with an electronic device, for example. The electronic device may include a sensor and a circuit.

[Example Operation of the First Example Structure]

An example operation of the first example structure described below is an embodiment of a power storage member monitoring method according to the present disclosure. The example operation of the power storage apparatus 100 shown in FIG. 3 is the same as the operation shown in the flowchart in FIG. 2, except that the power storage member 111 is replaced with a cell 1110. Specifically, the circuit 121 determines whether to designate a monitor target cell in accordance with criteria based on results of voltage measurement carried out more than once. If a positive determination result is obtained, the circuit 121 designates a monitor target cell, and continuously monitors the monitor target cell at least until the next designation.

With the power storage apparatus 100 shown in FIG. 3, the same effects as those of the power storage apparatus 100 shown in FIG. 1 can be achieved, and a cell 1110 with a high degree of degradation can be monitored with high accuracy.

[Second Example Structure]

Figure 4:
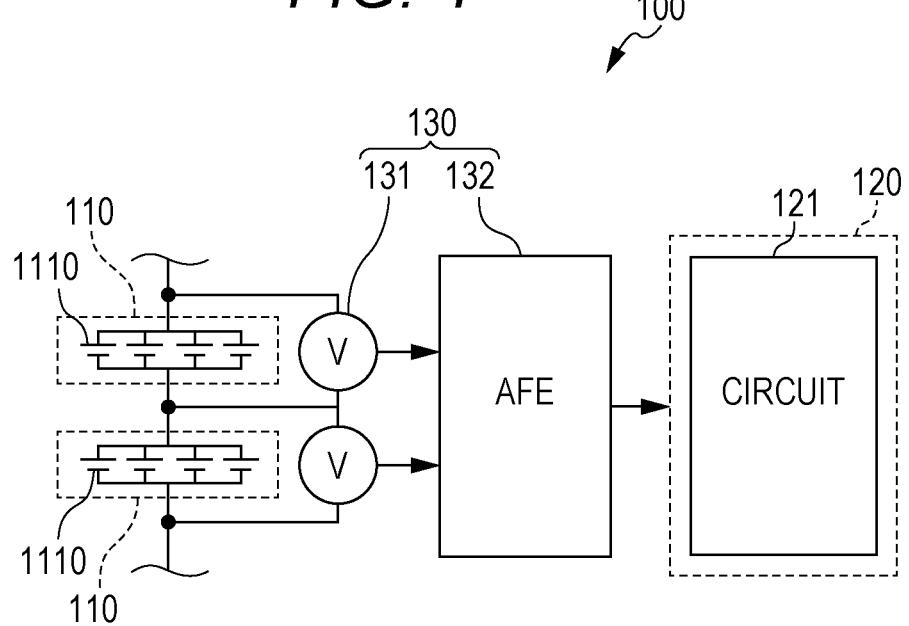
FIG. 4 is a diagram schematically showing a second example structure of a power storage member monitoring device according to a first modification of the first embodiment of the present disclosure.

FIG. 4 is a diagram schematically showing a second example structure of a power storage apparatus 100 of this modification. The power storage apparatus 100 shown in FIG. 4 has a more particular structure than that of the power storage apparatus 100 shown in FIG. 3.

Specifically, in the power storage apparatus 100 of this modification, each power storage block 110 is formed with cells 1110 that are connected in parallel. The connection state of the cells 1110 in each power storage block 110 is not limited to the parallel connection state shown in FIG. 4. In the power storage apparatus 100 shown in FIG. 4, the voltmeter 130 includes voltage sensors 131 and an analog front end (AFE) 132. The voltage sensors 131 are provided for the respective power storage blocks 110. The voltage sensors 131 are connected in parallel to the respective cells 1110 of the respective power storage blocks 110. Each voltage sensor 131 is designed to detect voltage of each corresponding power storage block 110 or cells 1110, and output the detection result as an analog signal to the analog front end 132. The analog front end 132 is designed to convert the analog signals input from the voltage sensors 131 into digital signals or analog signals that can be recognized by the circuit 121, and output the converted signals or results of voltage measurement to the circuit 121.

[Example Operation of the Second Example Structure]

An example operation of the second example structure described below is an embodiment of a power storage member monitoring method according to the present disclosure. The example operation of the power storage apparatus 100 shown in FIG. 4 is also the same as the operation shown in the flowchart in FIG. 2, except that the power storage member 111 is replaced with one or more cells 1110. In the case of the power storage apparatus 100 shown in FIG. 4, the monitor target cell may be all the cells 1110 included in one power storage block 110, or may be some (such as one) of the cells 1110 included in one power storage block 110.

With the power storage apparatus 100 shown in FIG. 4, the same effects as those of the power storage apparatus 100 shown in FIG. 1 can be achieved, and a large number of cells 1110 can be appropriately monitored.

3. Second Modification of the First Embodiment

Example Structure of an Apparatus

Figure 5:
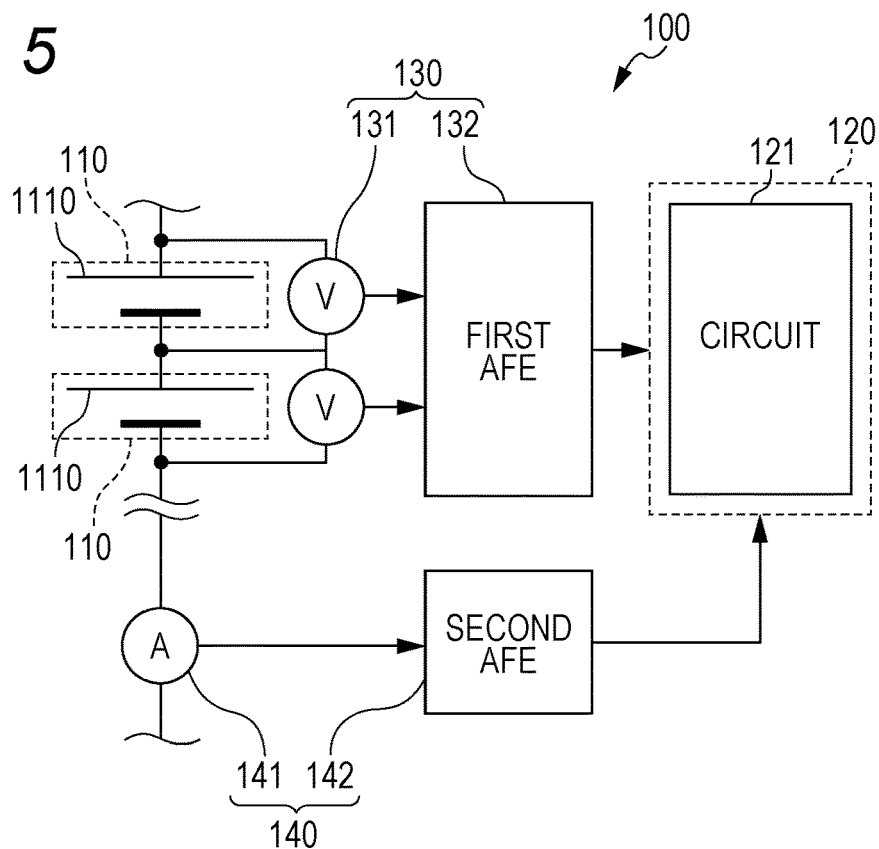
FIG. 5 is a diagram schematically showing an example structure of a power storage member monitoring device according to a second modification of the first embodiment of the present disclosure.

FIG. 5 is a diagram schematically showing an example structure of a power storage apparatus 100 of this modification. The power storage apparatus 100 shown in FIG. 5 has more particular monitor and measurement items than those of the power storage apparatus 100 shown in FIG. 4.

Specifically, in the power storage apparatus 100 of this modification, the circuit 121 is designed to monitor the monitor target cell by calculating the internal resistance of the monitor target cell or DC resistance (DCR). As shown in FIG. 5, as a specific example structure for calculating an internal resistance, the power storage apparatus 100 includes an ammeter 140 as well as the voltage sensors 131 and the analog front end 132 (hereinafter referred to the first analog front end) described above with reference to FIG. 4. The ammeter 140 is designed to measure current flowing in the power storage blocks 110. The ammeter 140 is not limited to any specific form, but a preferred example of the ammeter 140 includes a current sensor 141 and a second analog front end (AFE) 142 as shown in FIG. 5. The second analog front end 142 may be integrally formed with the first analog front end 132, or may be formed separately from the first analog front end 132. The current sensor 141 is connected to the electric circuit of the series-connected power storage blocks 110. The current sensor 141 is designed to detect the current flowing in the power storage blocks 110, and output the detection result as an analog signal to the second analog front end 142. The second analog front end 142 is designed to convert the analog signal input from the current sensor 141 into a digital signal or an analog signal that can be recognized by the circuit 121, and output the converted signal or a result of current measurement to the circuit 121.

The circuit 121 is designed to calculate an internal resistance based on results of voltage measurement carried out more than once on the monitor target cell and results of current measurement carried out more than once. Specifically, the circuit 121 may be designed to calculate an internal resistance based on changes in voltage of the monitor target cell and changes in current. In this case, the circuit 121 may also be designed to buffer, over a certain period of time, several pieces of data that are pairs of instantaneous values of current and instantaneous values of voltage that are input from the analog front ends 142 and 132, respectively. Here, the circuit 121 may also be designed to determine data that are pairs of changes in current (hereinafter referred to as a current change) and changes in voltage (hereinafter referred to as a voltage change) from the data of the pairs of instantaneous values. In this case, the circuit 121 may also be designed to calculate an internal resistance by performing straight-line approximation on the determined data that are the pairs of current changes and voltage changes, and determining the tilt of the straight line.

[Example Operation of the Apparatus]

An example operation of the power storage apparatus 100 of this modification described below is an embodiment of a power storage member monitoring method according to the present disclosure.

[Example Calculation of an Internal Resistance]

Figure 6:
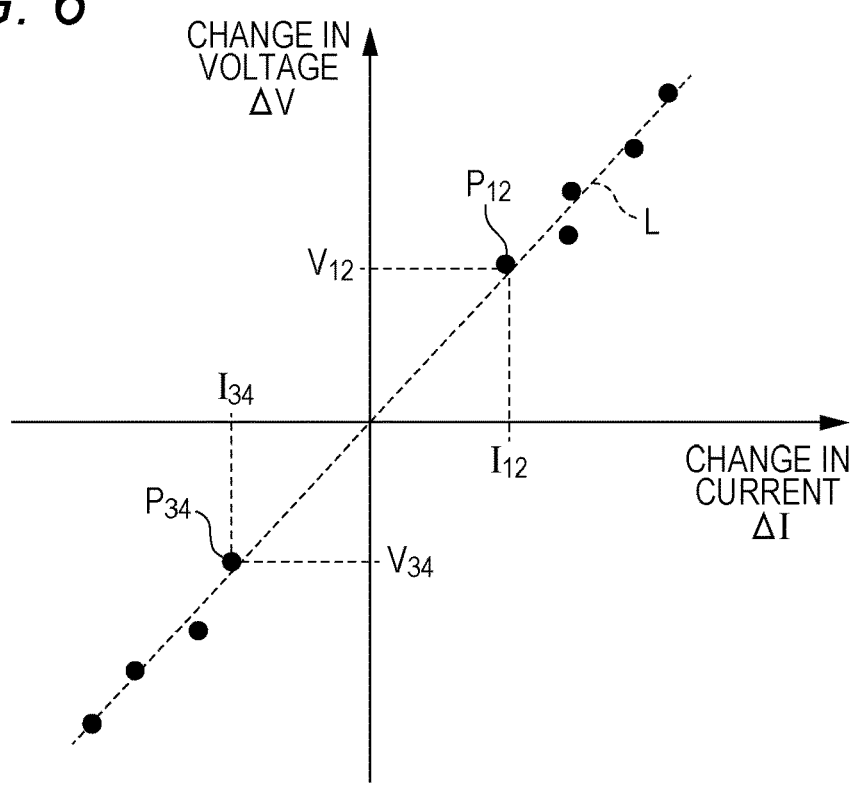
FIG. 6 is a graph in which current changes and voltage changes are plotted for explaining an example operation of the power storage member monitoring device according to the second modification of the first embodiment of the present disclosure.

FIG. 6 is a graph showing data of pairs of current changes and voltage changes plotted as points, where the abscissa axis indicates the current change $\Delta I$ [A] of the monitor target cell, and the ordinate axis indicates the voltage change $\Delta V$ [V] of the monitor target cell. The circuit 121 of this modification may store the graph shown in FIG. 6 as data into the storage area of the circuit 121 or the storage area of an external storage device that can be read by the circuit 121, for example. The graph shown in FIG. 6 may be drawn based on the data of pairs of instantaneous values of voltage and instantaneous values of current that are buffered at predetermined time intervals over a certain period of time as shown in Table 1 shown below, for example.

TABLE 1

Charge/discharge
Charge
Discharge
Time information
Current instantaneous value
Voltage instantaneous value The instantaneous values of current in Table 1 may be absolute values that are not affected by the direction of the current flowing in the power storage blocks 110. The charge/discharge in Table 1 are schematically shown to facilitate understanding of this modification, and are not necessarily the same as actual data. The time information in Table 1 is not necessary either, and may be replaced with some other information such as data numbers that are information for identifying the pairs of instantaneous values of current and instantaneous values of voltage. The data in Table 1 may be erased when monitor target cells are changed.

The current change $\Delta I_{12}$ and the voltage change $\Delta V_{12}$ corresponding to point $P_{12}$ in FIG. 6 may be calculated based on the data at time t1 and the data at time $t_2$ in Table 1. That is, $\Delta I_{12}$ is equal to $(I_2-I_1)$, and $\Delta V_{12}$ is equal to $(V_2-V_1)$. As shown in Table 1, charging is performed between time $t_1$ and time $t_2$. Therefore, $\Delta I_{12}$ and $\Delta V_{12}$ are both positive values, and $P_{12}$ belongs to the first quadrant in FIG. 6. Meanwhile, the current change $\Delta I_{34}$ and the voltage change $\Delta V_{34}$ corresponding to point $P_{34}$ in FIG. 6 may be calculated based on the data at time $t_3$ and the data at time $t_4$ in Table 1. That is, $\Delta I_{34}$ is equal to $(I_4-I_3)$, and $\Delta V_{34}$ is equal to $(V_4-V_3)$. As shown in Table 1, discharging is performed between time $t_3$ and time $t_4$. Therefore, $\Delta I_{34}$ and $\Delta V_{34}$ are both negative values, and $P_{34}$ belongs to the third quadrant in FIG. 6.

After performing the plotting, the circuit 121 performs straight-line approximation based on the respective points. The straight-line approximation is not limited to any specific form, and a regression line may be determined by the least squares method, for example. After determining the straight line L shown in FIG. 6, the circuit 121 calculates the internal resistance by calculating the tilt of the straight line L.

[Flowchart]

Figure 7:
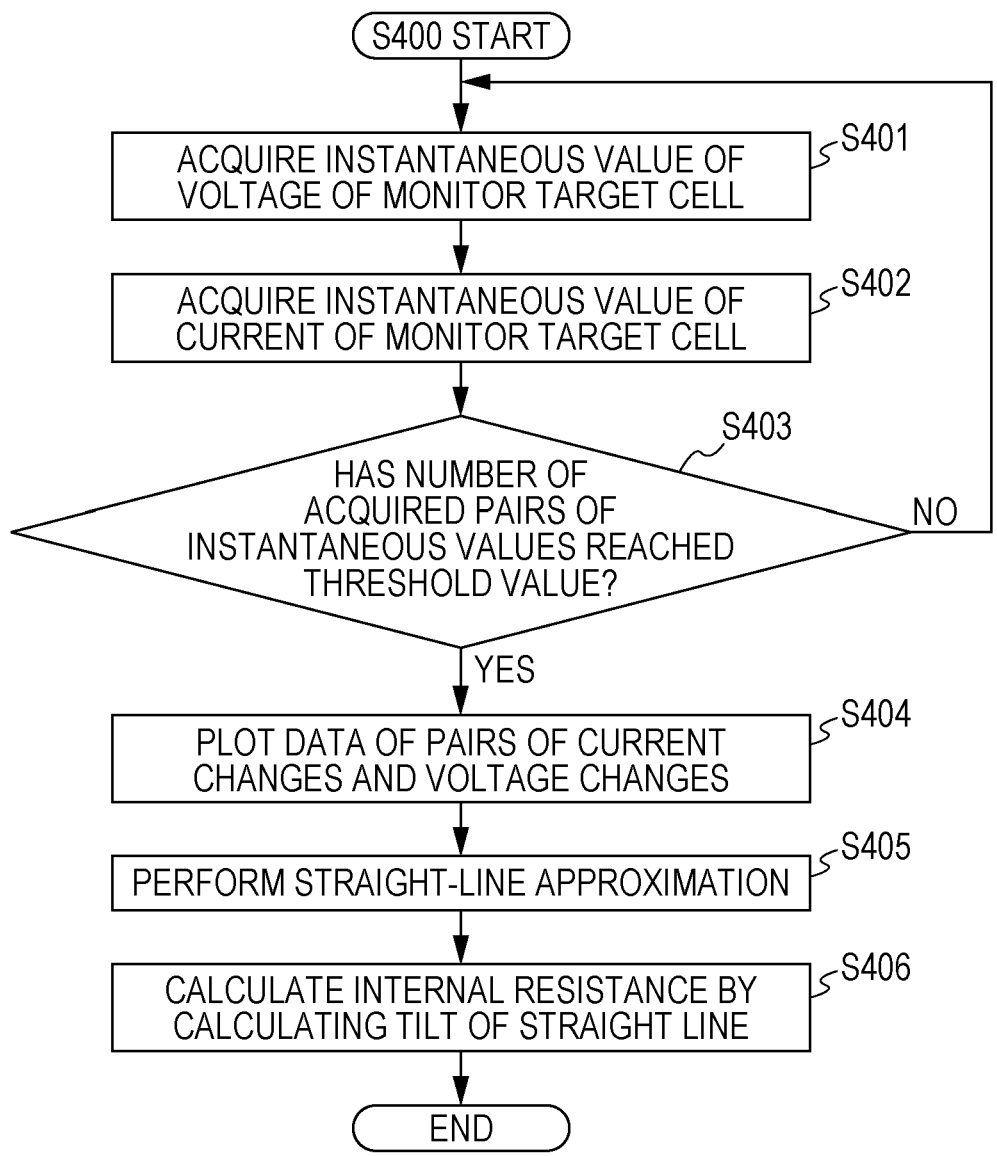
FIG. 7 is a flowchart showing an example operation of the power storage member monitoring device according to the second modification of the first embodiment of the present disclosure.

FIG. 7 is a flowchart showing an example operation of the power storage apparatus 100 of this modification. The power storage apparatus 100 of this modification carries out the series of procedures of steps 401 (S401) through 406 (S406) as a specific example of step 400 (S400) of FIG. 2.

In step 401 (S401), the circuit 121 acquires an instantaneous value of voltage of the monitor target cell. The circuit 121 may associate the acquired instantaneous value of voltage with time information acquired from a timer or the like, and store the instantaneous value of voltage associated with the time information into the storage area of the circuit 121 or the storage area of an external storage device that can be read by the circuit 121.

In step 402 (S402), the circuit 121 acquires an instantaneous value of current of the monitor target cell. The circuit 121 may associate the acquired instantaneous value of current with the instantaneous value of voltage acquired in step 401 (S401), and store the data of the pair of the instantaneous value of voltage and the instantaneous value of voltage into the storage area of the circuit 121 or the storage area of the external storage device that can be read by the circuit 121.

In step 403 (S403), the circuit 121 determines whether the number of acquired pairs of instantaneous values of current and instantaneous values of voltage acquired in steps 401 (S401) and 402 (S402) has reached a threshold value. In a case where a positive determination result is obtained, the operation moves on to step 404 (S404). In a case where a negative determination result is obtained, the operation returns to step 401 (S401).

In step 404 (S404), the circuit 121 determines data of pairs of current changes and voltage changes, and plots the data of the respective pairs on a graph.

In step 405 (S405), the circuit 121 performs straight-line approximation on the result of the plotting performed in step 404 (S404).

In step 406 (S406), the circuit 121 calculates an internal resistance by calculating the tilt of the straight line approximated in step 405 (S405).

The above described process may be performed at regular intervals by using interrupts with a timer or the like included in the circuit 121.

In the power storage apparatus 100 of this modification, the circuit 121 is designed not to designate a monitor target cell unless results of voltage measurement carried out more than once are obtained. Accordingly, the current monitor target cell can be accurately monitored over a sufficient period of time, while voltage measurement is carried out more than once. Specifically, a highly accurate internal resistance can be calculated, as the data of a sufficient number of pairs of current changes and voltage changes can be obtained with respect to the current monitor target cell. In a case where an internal resistance is calculated only from one voltage change and one current change, for example, the internal resistance can be calculated simply by dividing the voltage change by the current change. Such an internal resistance calculation method may be used if sufficient synchrony is secured between a result of voltage measurement and a result of current measurement. However, the use of this modification is preferable if it is difficult to secure synchrony.

4. Second Embodiment

Example Structure of an Apparatus

In a power storage apparatus 100 of this embodiment, a circuit 121 is designed to designate a monitor target cell that is a cell 1110 of a power storage block 110 that has the lowest voltage at a relatively high frequency among power storage blocks 110.

The frequency of having the lowest voltage is not particularly limited. The frequency may be a value relative to the number of times the lowest voltage is recognized during voltage measurement carried out more than once. The frequency may be the number of times the lowest voltage is recognized. The power storage block 110 that has a relatively high frequency may be the power storage block 110 that has the highest frequency or the power storage block 110 that has the nth highest frequency. The power storage block 110 that has a relatively high frequency may be a power storage block 110 that has a higher frequency than a threshold frequency.

In a more specific example structure for embodying this modification, the circuit 121 may be designed to identify the power storage block 110 having the lowest voltage every time acquiring results of voltage measurement carried out on the power storage blocks 110. The circuit 121 may also store information unique to the identified power storage block 110 having the lowest voltage into the storage area of the circuit 121 or the storage area of an external storage device that can be read by the circuit 121. The unique information is not limited to any specific form, and may be the number allotted to a cell 1110 or the number allotted to the power storage block 110, for example. The circuit 121 may determine the frequency based on the number of times unique information is stored with respect to each power storage block 110.

[Example Operation of the Apparatus]

Figure 8:
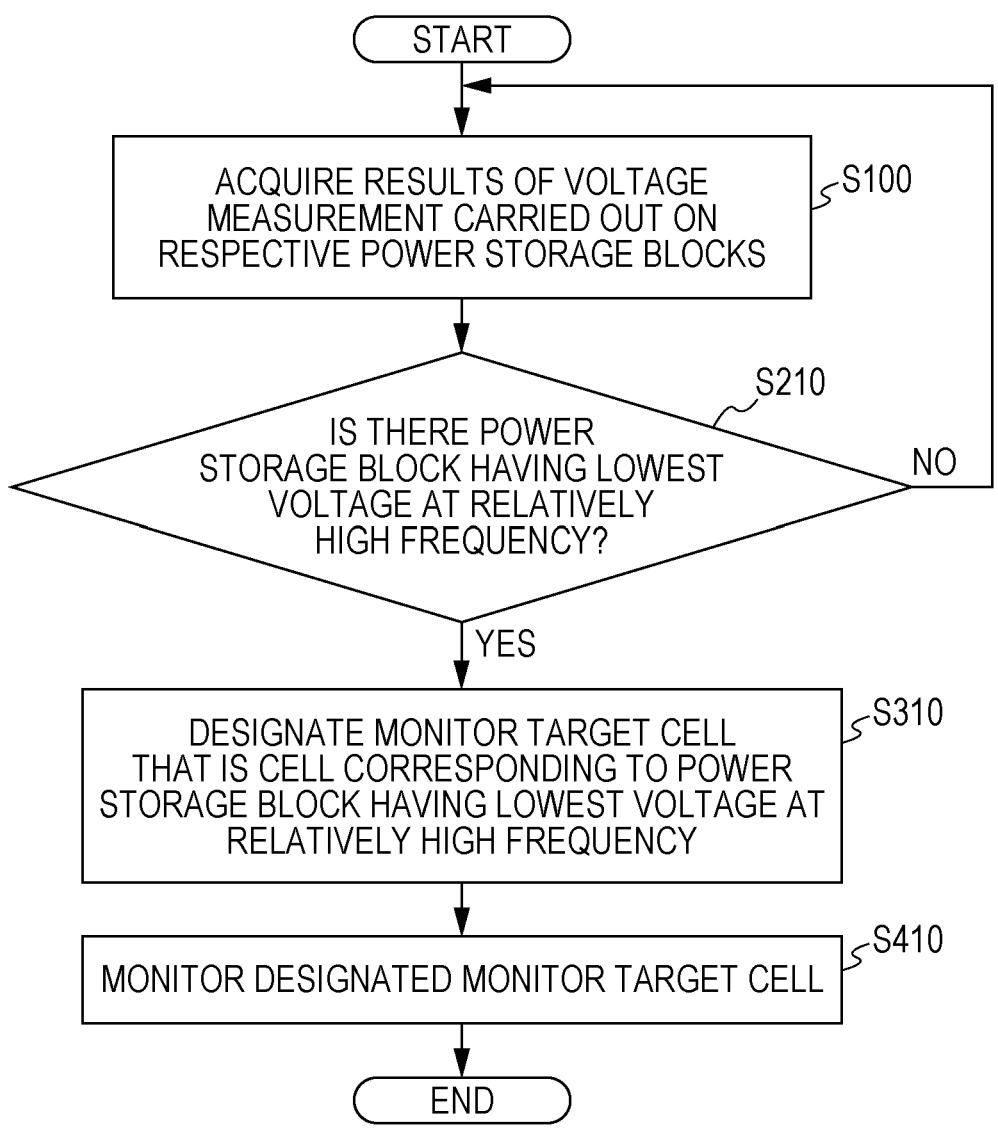
FIG. 8 is a flowchart showing an example operation of a power storage member monitoring device according to a second embodiment of the present disclosure.

FIG. 8 is a flowchart showing an example operation of the power storage apparatus 100 of this embodiment. The example operation shown in FIG. 8 is an embodiment of a power storage member monitoring method according to the present disclosure.

The power storage apparatus 100 of this embodiment carries out steps 210 (S210), 310 (S310), and 410 (S410) shown in FIG. 8 as specific examples of steps 200 (S200), 300 (S300), and 400 (S400) of FIG. 2, respectively.

Specifically, in step 210 (S210), the circuit 121 determines whether there is a power storage block 110 that has the lowest voltage at a relatively high frequency. In a case where a positive determination result is obtained, the operation moves on to step 310 (S310). In a case where a negative determination result is obtained, the operation returns to step 100 (S100).

In step 310 (S310), the circuit 121 designates a monitor target cell that is a cell 1110 of the power storage block 110 that has the lowest voltage at a relatively high frequency.

In step 410 (S410), the circuit 121 monitors the monitor target cell designated in the previous step.

Here, having the lowest voltage at a relatively high frequency indicates that there is a large voltage drop due to an IR drop, or the cell 1110 has been degraded due to an increase in internal resistance. Accordingly, as in the power storage apparatus 100 of this embodiment, a cell 1110 that has been truly degraded can be monitored with high certainty by designating a monitor target cell based on the frequency of having the lowest voltage.

Furthermore, in the power storage apparatus 100 of this embodiment, the monitor target cell is limited to a cell 1110 that has a high frequency of having the lowest voltage reflecting a high degree of degradation, and accordingly, the processing load of monitoring can be reduced. Specifically, in a case where the internal resistances of all the cells 1110 of all the power storage blocks 110 are calculated, large proportions of resources such as memory and processing time are occupied, which is not preferable particularly when a low-power-consuming microcomputer with small amounts of resources is used. In this embodiment, the monitor target or the calculation target is narrowed down, so that required resources can be reduced. As a result, even in a case where the CPU and memory in a low-power-consuming microcomputer that puts priority on measurement and communication are used, for example, it is possible to track down degradation levels at high speed with a small amount of memory use. That is, according to this embodiment, it is possible to save power, lower costs, or efficiently monitor the degradation level of an assembled battery.

5. Third Embodiment

Example Structure of an Apparatus

In a power storage apparatus 100 of this embodiment, a circuit 121 has a more particular structure than that of the power storage apparatus 100 of the second embodiment.

Specifically, the circuit 121 of this embodiment is designed to designate a monitor target cell that is a cell 1110 of a power storage block 110 that has the lowest voltage a relatively large number of times among power storage blocks 110. The power storage block 110 that has the lowest voltage a relatively large number of times may be the power storage block 110 that has the lowest voltage the largest number of times or the power storage block 110 that has the lowest voltage the nth largest number of times. The power storage block 110 that has the lowest voltage a relatively large number of times may be a power storage block 110 that has the lowest voltage a larger number of times than a threshold value. The numbers of times the respective power storage blocks 110 have the lowest voltage may be counted by a functional block of the circuit 121 such as a counter, or may be counted by an external counter.

The circuit 121 may also store information unique to the identified power storage block 110 having the lowest voltage into the storage area of the circuit 121 or the storage area of an external storage device that can be read by the circuit 121. In this case, the circuit 121 may determine the number of times the lowest voltage is observed based on the number of times unique information is stored with respect to each power storage block 110. However, the circuit 121 is not limited to such a configuration. Voltages may be compared with one another by a comparator included in the circuit 121, but may be compared with one another in some other way.

[Example Operation of the Apparatus]

Figure 9:
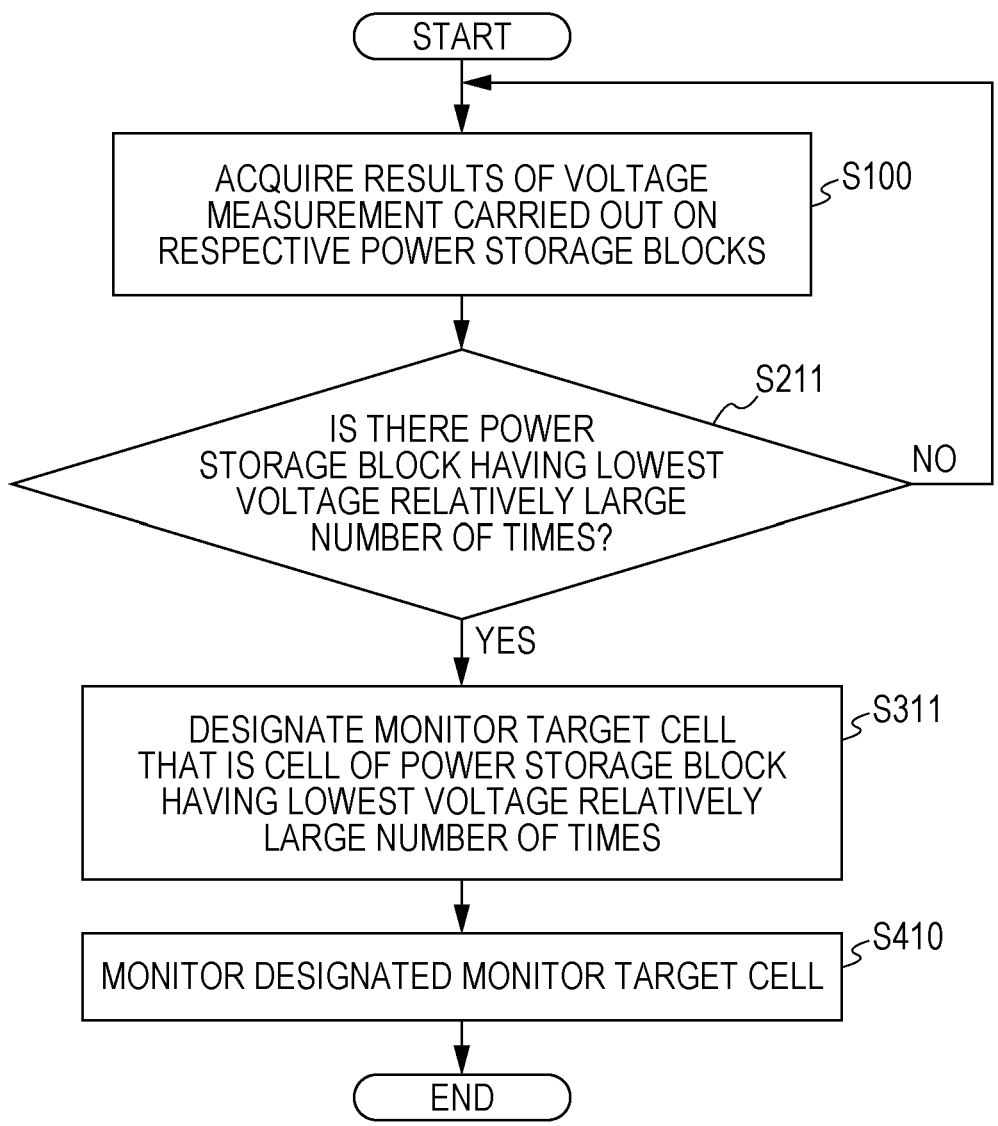
FIG. 9 is a flowchart showing an example operation of a power storage member monitoring device according to a third embodiment of the present disclosure.

FIG. 9 is a flowchart showing an example operation of the power storage apparatus 100 of this embodiment. The example operation shown in FIG. 9 is an embodiment of a power storage member monitoring method according to the present disclosure.

The power storage apparatus 100 of this embodiment carries out step 211 (S211) of FIG. 9 as a specific example of step 210 (S210) of FIG. 8. The power storage apparatus 100 of this embodiment carries out step 311 (S311) of FIG. 9 as a specific example of step 310 (S310) of FIG. 8.

Specifically, in step 211 (S211), the circuit 121 determines whether there is a power storage block 110 that has the lowest voltage a relatively large number of times, as shown in FIG. 9. In a case where a positive determination result is obtained, the operation moves on to step 311 (S311). In a case where a negative determination result is obtained, the operation returns to step 100 (S100).

In step 311 (S311), the circuit 121 designates a monitor target cell that is a cell 1110 of the power storage block 110 that has the lowest voltage a relatively large number of times.

With the power storage apparatus 100 of this embodiment, the same effects as those of the power storage apparatus 100 of the second embodiment can be achieved. Also, in the power storage apparatus 100, the monitor target cell can be readily and appropriately narrowed down based on the number of times the lowest voltage is observed. Accordingly, processing load can be more effectively reduced, and the monitor target can be more effectively monitored with even higher certainty.

6. First Modification of the Third Embodiment

Example Structure of an Apparatus

In a power storage apparatus 100 of this modification, a circuit 121 has a more particular structure than that of the power storage apparatus 100 described above with reference to FIG. 9.

Specifically, the circuit 121 of this modification is designed to designate a monitor target cell that is a cell 1110 of a power storage block 110 that has the lowest voltage a larger number of times than a threshold value among power storage blocks 110. The power storage block 110 that has the lowest voltage a larger number of times than the threshold value may be the one power storage block 110 to exceed the threshold value first since a reference point of time. Alternatively, the power storage blocks 110 that have the lowest voltage a larger number of times than the threshold value may be the first power storage block 110 to exceed the threshold value first, and the one or more power storage blocks 110 to exceed the threshold value after the first power storage block 110 to exceed the threshold value. The reference point of time may be the point of time at which the current monitor target cell was designated as the monitor target, or may be the point of time at which the counter was reset after the current monitor target cell was designated, for example. However, the reference point of time is not limited to any of them. There may be more than one threshold value of the number of times the lower voltage is observed in conjunction with other conditions for designating a monitor target. In a case where a check is made to determine whether to designate a monitor target cell at regular intervals, the threshold value of the number of times the lowest voltage is observed may involve a time unit. In that case, the product of the number of times the lower voltage is observed and each interval at which a check is made to determine whether to designate a monitor target cell is compared with the threshold value.

[Example Operation of the Apparatus]

Figure 10:
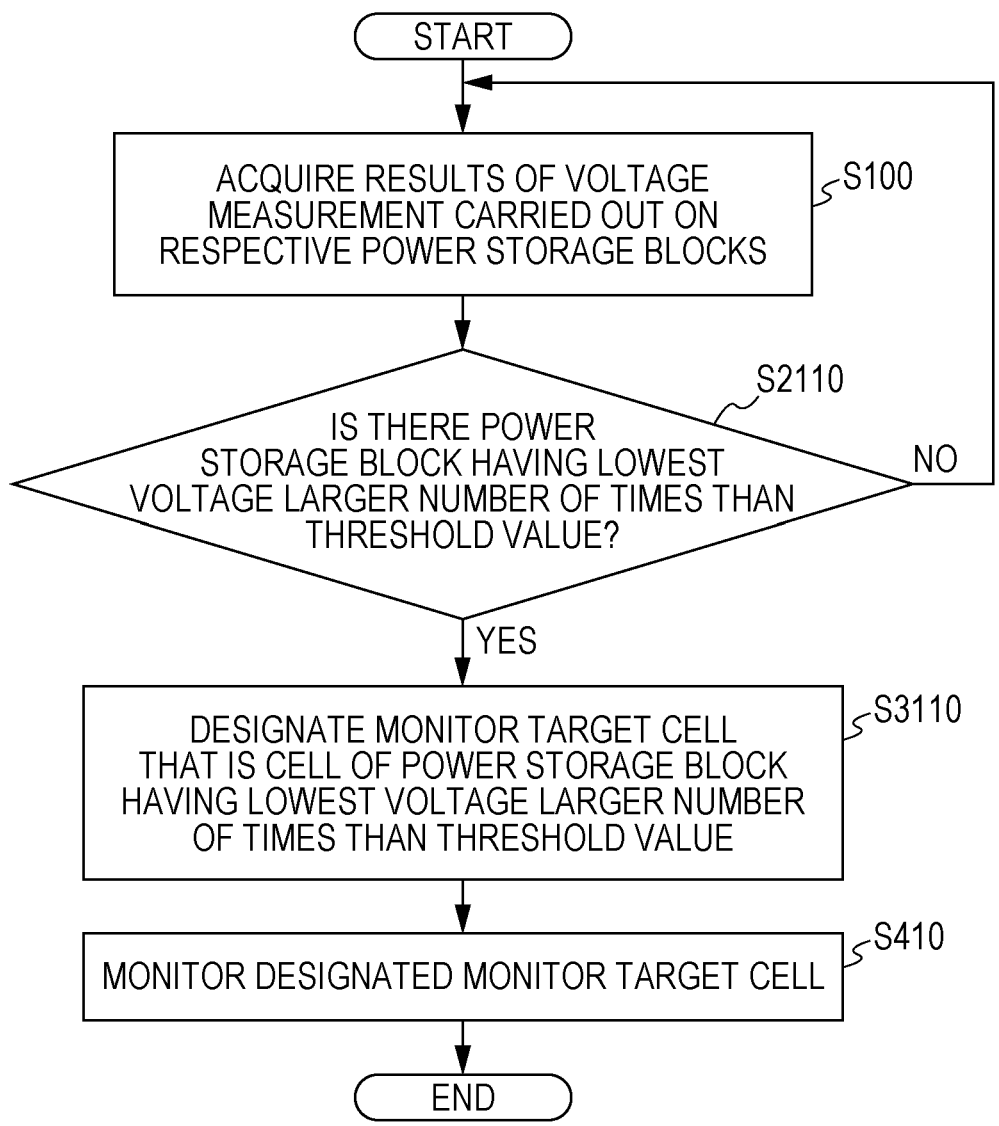
FIG. 10 is a flowchart showing an example operation of a power storage member monitoring device according to a first modification of the third embodiment of the present disclosure.

FIG. 10 is a flowchart showing an example operation of the power storage apparatus 100 of this modification. The example operation shown in FIG. 10 is an embodiment of a power storage member monitoring method according to the present disclosure.

The power storage apparatus 100 of this modification carries out step 2110 (S2110) of FIG. 10 as a specific example of step 211 (S211) of FIG. 9. The power storage apparatus 100 of this modification carries out step 3110 (S3110) of FIG. 10 as a specific example of step 311 (S311) of FIG. 9.

Specifically, in step 2110 (S2110), the circuit 121 determines whether there is a power storage block 110 that has the lowest voltage a larger number of times than the threshold value, as shown in FIG. 10. In a case where a positive determination result is obtained, the operation moves on to step 3110 (S3110). In a case where a negative determination result is obtained, the operation returns to step 100 (S100).

In step 3110 (S3110), the circuit 121 designates a monitor target cell that is a cell 1110 of the power storage block 110 that has the lowest voltage a larger number of times than the threshold value.

With the power storage apparatus 100 of this modification, the same effects as those of the power storage apparatus 100 of the second embodiment can be achieved. Also, in the power storage apparatus 100 of this modification, monitor target cells are not changed until the number of times the lowest voltage is observed exceeds the threshold value. Accordingly, accuracy and readiness of monitoring can be effectively secured.

7. Second Modification of the Third Embodiment

Example Structure of an Apparatus

In a power storage apparatus 100 of this modification, a circuit 121 has a more particular structure than that of the power storage apparatus 100 described above with reference to FIG. 10.

Specifically, the circuit 121 of this modification is designed to determine a monitor target cell based on a threshold value of the number of times the lowest voltage is observed, and determine the cell number of the monitor target cell. In a more specific example structure, the circuit 121 may manage information for designating a monitor target cell associated with a cell number. The information may indicate results of voltage measurement, the power storage block having the lowest voltage, the number of times the lowest voltage is observed, and whether the number of times the lowest voltage is observed has exceeded the threshold value. For example, in a case where the power storage apparatus 100 has voltage input terminals for the respective power storage blocks 110, the circuit 121 may link the results of voltage measurement carried out on the power storage blocks 110 to cell numbers by associating the respective voltage input terminals with the respective cell numbers. In a case where the power storage apparatus 100 performs switching control in a time-division manner based on the cell numbers so as to switch power storage blocks 110 from which voltage measurement results are to be acquired, the circuit 121 may link the voltage measurement results to the cell numbers based on the contents of the control. The method of linking the information for designating a monitor target cell to the cell numbers is not limited to the above described method.

[Example Operation of the Apparatus]

Figure 11:
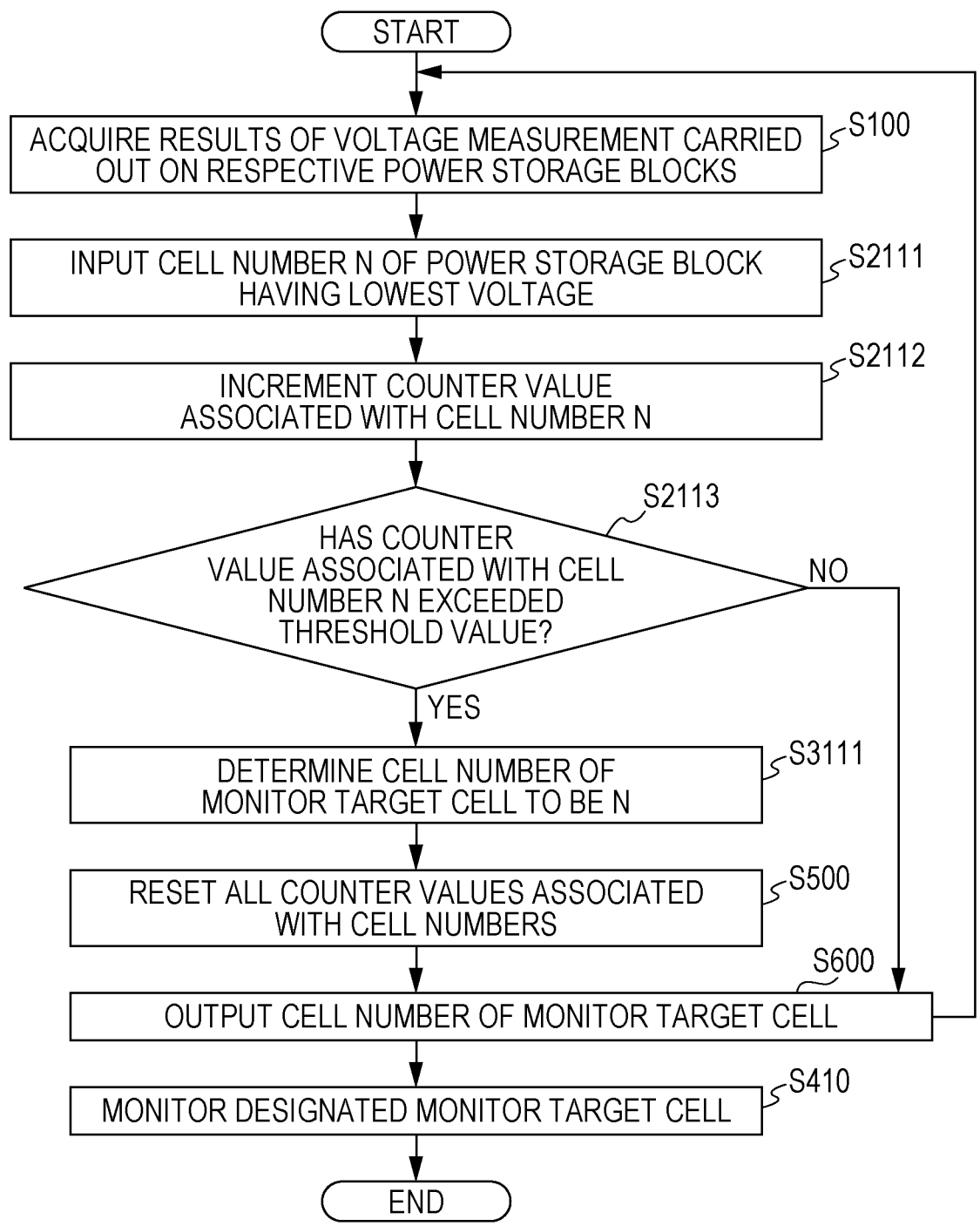
FIG. 11 is a flowchart showing an example operation of a power storage member monitoring device according to a second modification of the third embodiment of the present disclosure.

FIG. 11 is a flowchart showing an example operation of the power storage apparatus 100 of this modification. The example operation shown in FIG. 11 is an embodiment of a power storage member monitoring method according to the present disclosure.

The power storage apparatus 100 of this modification carries out the series of procedures of steps 2111 (S2111) through 2113 (S2113) of FIG. 11 as a specific example of step 2110 (S2110) of FIG. 10. The power storage apparatus 100 of this modification carries out step 3111 (S3111) of FIG. 11 as a specific example of step 3110 (S3110) of FIG. 10. The power storage apparatus 100 of this modification carries out steps 500 (S500) and 600 (S600) as a specific example of step 410 (S410).

Specifically, in step 2111 (S2111), the circuit 121 inputs the cell number (N, for example) of the power storage block 110 having the lowest voltage to the determining block of the circuit 121 based on the voltage measurement results acquired in step 100 (S100), as shown in FIG. 11. The determining block is the functional block that designates a monitor target cell in the circuit 121. In a case where the power storage block 110 is formed with a single cell 1110, the cell number N detected in this step is the cell number of the single cell 1110. In a case where the power storage block 110 is formed with cells 1110, the cell number N detected in this step may be the cell number allotted to all the cells 1110 forming the power storage block 110 or may be the cell number allotted to a representative cell 1110.

In step 2112 (S2112), the determining block of the circuit 121 increments the value of the counter associated with the cell number N input in step 2111 (S2111) among counters prepared beforehand for the respective cell numbers.

In step 2113 (S2113), the determining block of the circuit 121 determines whether the counter value that is associated with the cell number N and was incremented in step 2112 (S2112) has exceeded the threshold value. In a case where a positive determination result is obtained, the operation moves on to step 3111 (S3111). In a case where a negative determination result is obtained, the operation returns to step 100 (S100) via step 600 (S600).

In step 3111 (S3111), the determining block of the circuit 121 determines the cell number N to be the cell number of the monitor target cell. If the cell number N differs from the cell number of the current monitor target cell, monitor targets are changed in step 3111 (S3111). If the cell number N is the same as the cell number of the current monitor target cell, the current monitor target is maintained in step 3111 (S3111).

In step 500 (S500), which comes immediately after step 3111 (S3111), the determining block of the circuit 121 resets all the counter values associated with the cell numbers, and moves on to step 600 (S600).

In step 600 (S600), the determining block of the circuit 121 outputs the cell number of the monitor target cell. The output of step 600 (S600) may be directed to the subject of the next step 410 (S410) or the internal resistance calculating block in the circuit 121, for example. In a case where the operation moves from step 2113 (S2113) on to step 600 (S600), the cell number of the current monitor target cell is output.

With the power storage apparatus 100 of this modification, the same effects as those of the power storage apparatus 100 shown in FIG. 10 can be achieved, or control can be simplified by collectively managing various measurement results and calculation results with respect to the cells 1110 associated with cell numbers.

8. Third Modification of the Third Embodiment

First Example Structure

In a first example structure of a power storage apparatus 100 of this modification, a circuit 121 has a more particular structure than that of the power storage apparatus 100 described above with reference to FIG. 11.

Specifically, the circuit 121 in this example structure is designed to preferentially designate a monitor target cell that is a cell 1110 of a second power storage block that has the lowest voltage a larger number of times than a second threshold value that is smaller than a first threshold value, and satisfies temperature conditions. Also, the circuit 121 in this example structure is designed to designate a monitor target cell that is a cell of a first power storage block having the lowest voltage a larger number of times than the first threshold value, when any second power storage block does not exist. The temperature conditions may involve temperatures of power storage blocks 110. Having the lowest temperature may be at least one of the temperature conditions. The temperature conditions may involve a temperature threshold value.

Figure 12:
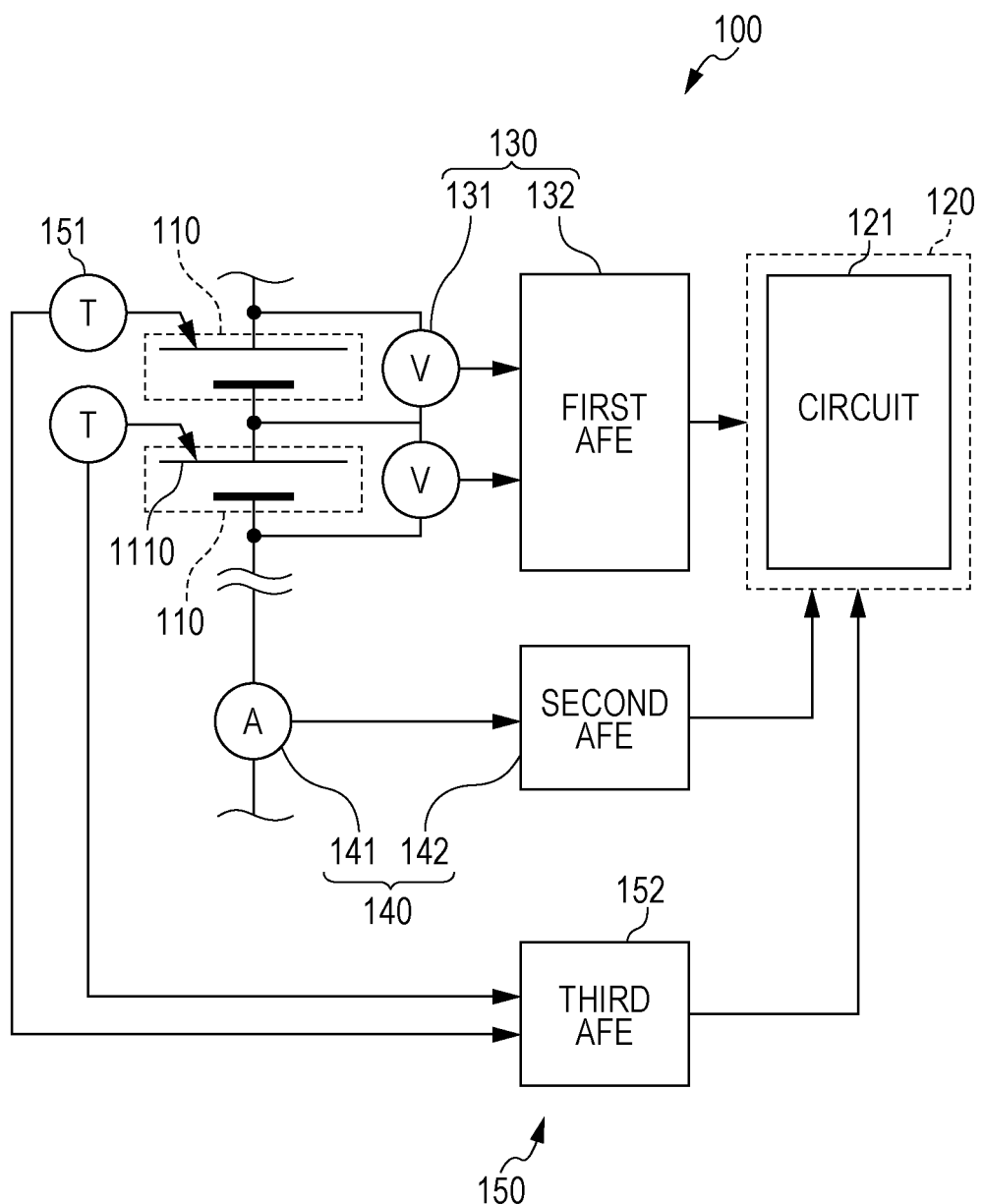
FIG. 12 is a diagram schematically showing a first example structure of a power storage member monitoring device according to a third modification of the third embodiment of the present disclosure.

As shown in FIG. 12, as a specific example structure for designating a cell of a second power storage block as a monitor target cell, the power storage apparatus 100 of this example structure further includes a thermometer 150 as well as the components shown in FIG. 5. The thermometer 150 is designed to measure temperatures of the respective power storage blocks 110. The thermometer 150 is not limited to any specific form, but a preferred example of the thermometer 150 includes temperature sensors 151 and a third analog front end (AFE) 152 as shown in FIG. 12. The third analog front end 152 may be integrally formed with the other analog front ends 132 and 142, or may be formed separately from the other analog front ends 132 and 142. The temperature sensors 151 are provided for the respective cells 1110 of the respective series-connected power storage blocks 110. Each temperature sensor 151 is designed to detect temperature of each corresponding power storage block 110 or cell 1110, and output the detection result as an analog signal to the third analog front end 152. The third analog front end 152 is designed to convert the analog signals input from the temperature sensors 151 into digital signals or analog signals that can be recognized by the circuit 121, and output the converted signals or results of temperature measurement to the circuit 121.

[Second Example Structure]

Figure 13:
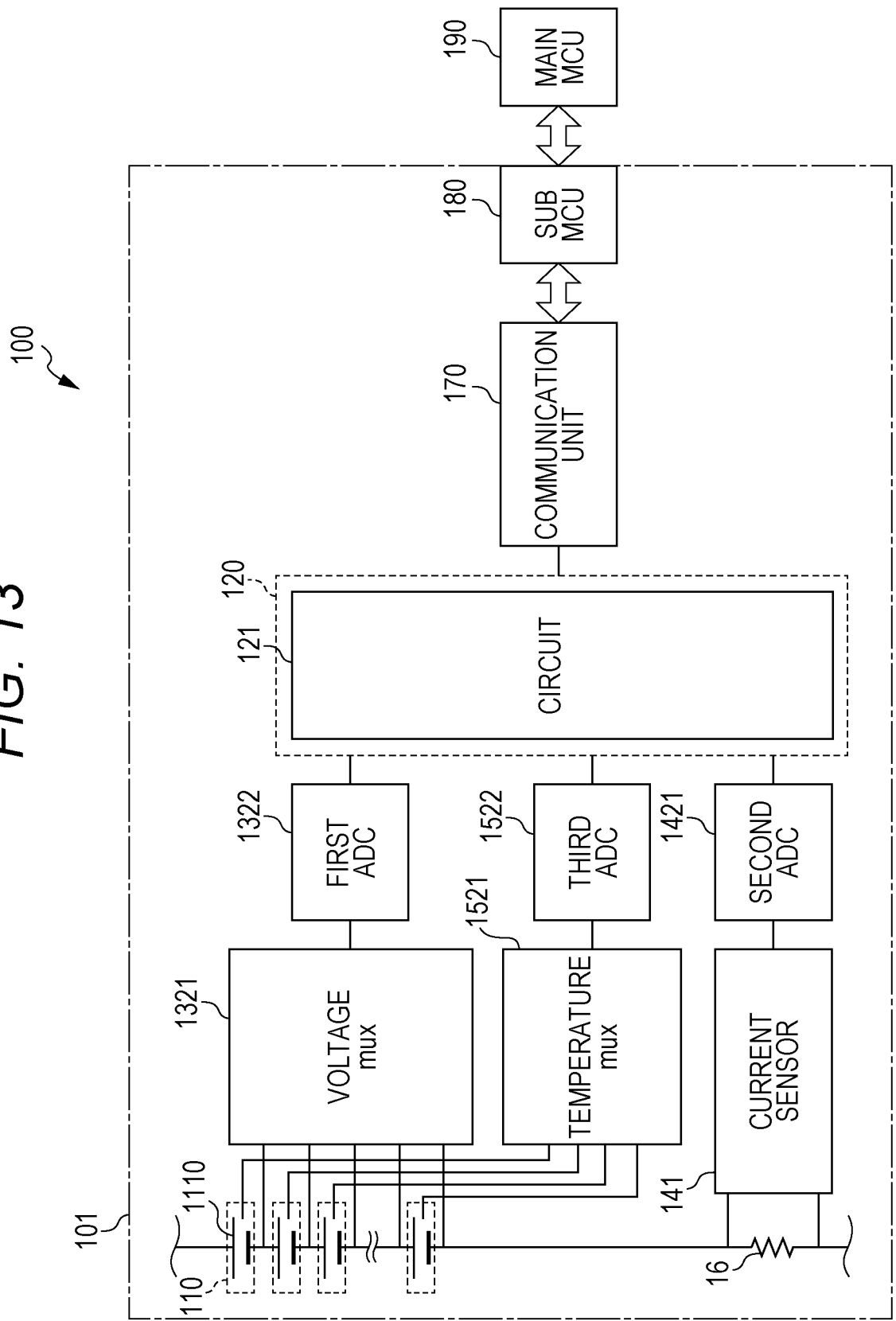
FIG. 13 is a diagram schematically showing a second example structure of the power storage member monitoring device according to the third modification of the third embodiment of the present disclosure.

As an even more specific example of the power storage apparatus 100 shown in FIG. 12, the second example structure shown in FIG. 13 may be used. The power storage apparatus 100 of this example structure includes a voltage multiplexer (mux) 1321. Results of voltage detection performed on the respective power storage blocks 110 by the respective voltage sensors 131 (see FIG. 12) are input as analog signals to the voltage multiplexer 1321. The voltage multiplexer 1321 selectively outputs the input results of the voltage detection performed on the respective power storage blocks 110 in a time-division manner. A first A-D converter (ADC) 1322 is provided in the stage that comes immediately after the voltage multiplexer 1321. The analog signals output from the voltage multiplexer 1321 are input to the first A-D converter 1322. The first A-D converter 1322 converts the input analog signals into digital signals, and outputs the digital signals to the circuit 121. The voltage multiplexer 1321 and the first A-D converter 1322 may constitute a first analog front end 132.

The power storage apparatus 100 of this example structure also includes a temperature multiplexer (mux) 1521. Results of temperature detection performed on the respective power storage blocks 110 by the respective temperature sensors 151 (see FIG. 12) are input as analog signals to the temperature multiplexer 1521. The temperature multiplexer 1521 selectively outputs the input results of the temperature detection performed on the respective power storage blocks 110 in a time-division manner. A third A-D converter (ADC) 1522 is provided in the stage that comes immediately after the temperature multiplexer 1521. The analog signals output from the temperature multiplexer 1521 are input to the third A-D converter 1522. The third A-D converter 1522 converts the input analog signals into digital signals, and outputs the digital signals to the circuit 121. The temperature multiplexer 1521 and the third A-D converter 1522 may constitute a third analog front end 152.

Further, a current sensor 141 in the power storage apparatus 100 of this example structure is designed to detect voltages at both ends of a current-detecting resistance 16 connected in series to the electric circuit of the power storage blocks 110, and output the detected voltages as a result of current detection. A second A-D converter (ADC) 1421 is provided in the stage that comes immediately after the current sensor 141. The analog signals output from the current sensor 141 are input to the second A-D converter 1421. The second A-D converter 1421 converts the input analog signals into digital signals, and outputs the digital signals to the circuit 121. The second A-D converter 1421 may form a second analog front end 142. An amplifier may be provided in the stage that comes immediately before the second A-D converter 1421.

The power storage apparatus 100 of this example structure further includes a communication unit 170, a sub micro controller unit (SUB MCU) 180, and a main micro controller unit (MAIN MCU) 190. The communication unit 170 and the sub micro controller unit 180, together with the power storage blocks 110, the power storage member monitoring device 120, the respective measuring units 130 through 150, and the resistance 16, constitute a power storage assembly 101 or a power storage module. The communication unit 170 is designed to connect the circuit 121 to the sub micro controller unit 180 through communication. The sub micro controller unit 180 is designed to control operation of the power storage assembly 101. The power storage assembly 101 may be housed in an exterior case or a system rack.

In the power storage apparatus 100 of this example structure, power storage assemblies 101 are connected to the main micro controller unit 190 through communication, and the main micro controller unit 190 is designed to collectively control operations of the respective power storage assemblies 101.

[First Example Operation]

Figure 14:
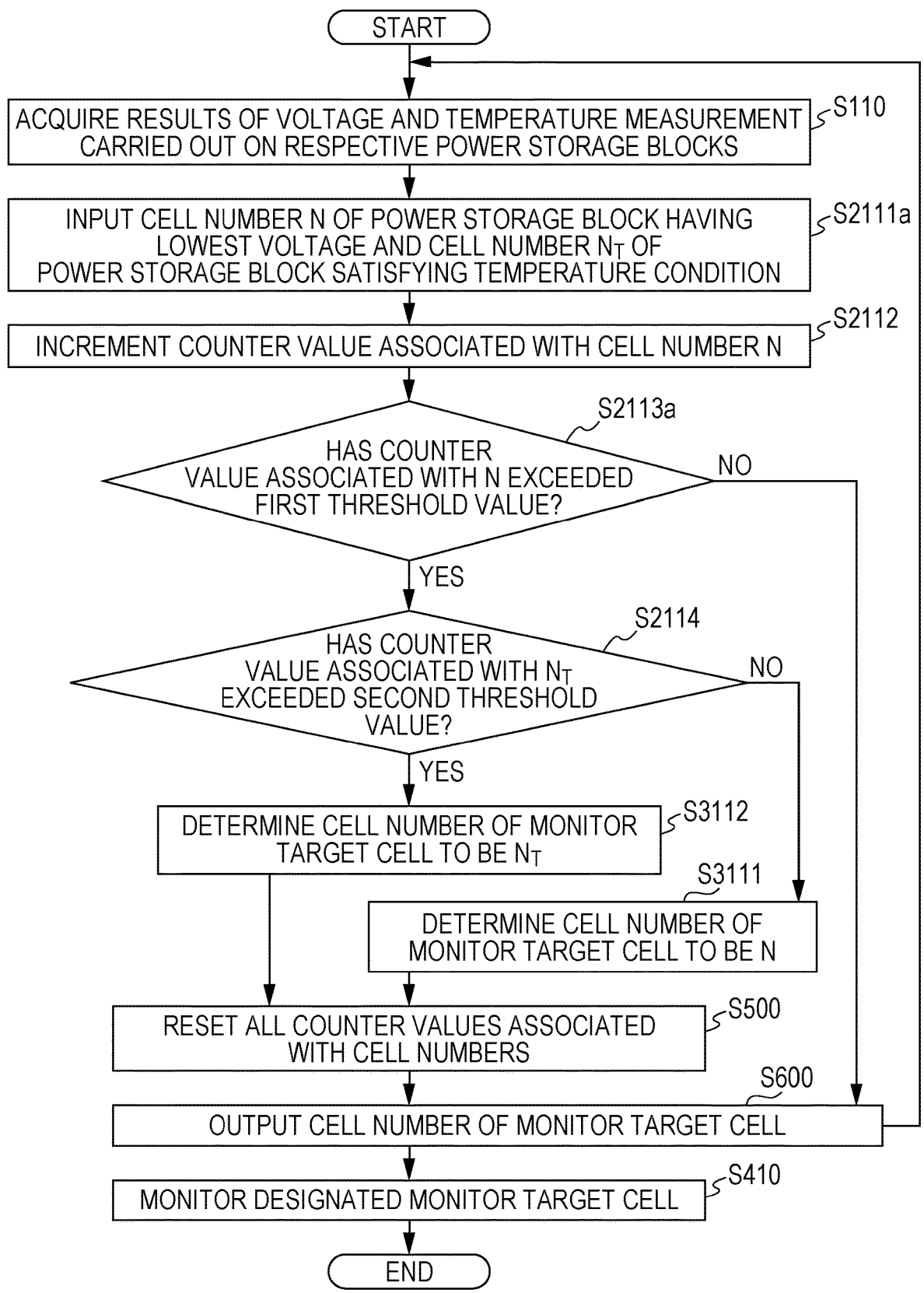
FIG. 14 is a flowchart showing a first example operation of the power storage member monitoring device according to the third modification of the third embodiment of the present disclosure.

FIG. 14 is a flowchart showing a first example operation of the power storage apparatus 100 of this modification. This example operation is an embodiment of a power storage member monitoring method according to the present disclosure. The subject of this example operation may be either of the first example structure shown in FIG. 12 and the second example structure shown in FIG. 13, or some other structure.

In this example operation, step 110 (S110) of FIG. 14 is carried out as a specific example of step 100 (S100) of FIG. 11. In this example operation, step 2111a (S2111a) of FIG. 14 is carried out, instead of step 2111 (S2111) of FIG. 11. In this example operation, step 2113a (S2113a) of FIG. 14 is carried out, instead of step 2113 (S2113) of FIG. 11. In this example operation, steps 2114 (S2114) and 3112 (S3112) are carried out between step 2113a (S2113a) and step 500 (S500).

Specifically, in step 110 (S110), the circuit 121 acquires results of voltage measurement and temperature measurement carried out on each of the power storage blocks 110.

In step 2111a (S2111a), the circuit 121 inputs the cell number N of the power storage block 110 having the lowest voltage to the determining block of the circuit 121 based on the voltage measurement results acquired in step 110 (S110). In step 2111a (S2111a), the circuit 121 also inputs the cell number ($N_T$, for example) of the power storage block 110 satisfying the temperature conditions to the determining block of the circuit 121 based on the temperature measurement results acquired in step 110 (S110).

In step 2113a (S2113a), the determining block of the circuit 121 determines whether the counter value that is associated with the cell number N and was incremented in step 2112 (S2112) has exceeded the first threshold value. In a case where a positive determination result is obtained, the operation moves on to step 2114 (S2114). In a case where a negative determination result is obtained, the operation returns to step 110 (S110) via step 600 (S600). In a case where a positive determination result is obtained in step 2113a (S2113a), the power storage block corresponding to the cell number N is the first power storage block.

In step 2114 (S2114), the determining block of the circuit 121 determines whether the counter value associated with the cell number $N_T$ has exceeded the second threshold value. In a case where $N_T$ is equal to N, the counter value associated with the cell number $N_T$ is the value incremented in step 2112 (S2112) in the current determination cycle. In a case where $N_T$ is not equal to N, the counter value associated with the cell number $N_T$ may be the value incremented in step 2112 (S2112) in the previous or earlier determination cycle. In a case where a positive determination result is obtained in step 2114 (S2114), the operation moves on to step 3112 (S3112). In a case where a negative determination result is obtained in step 2114 (S2114), the operation moves on to step 3111 (S3111). In a case where a positive determination result is obtained in step 2114 (S2114), the power storage block corresponding to the cell number $N_T$ is the second power storage block.

In step 3112 (S3112), the determining block of the circuit 121 determines the cell number $N_T$ to be the cell number of the monitor target cell. If the cell number $N_T$ differs from the cell number of the current monitor target cell, monitor targets are changed in step 3112 (S3112). If the cell number $N_T$ is the same as the cell number of the current monitor target cell, the current monitor target is maintained in step 3112 (S3112).

[Second Example Operation]

Figure 15:
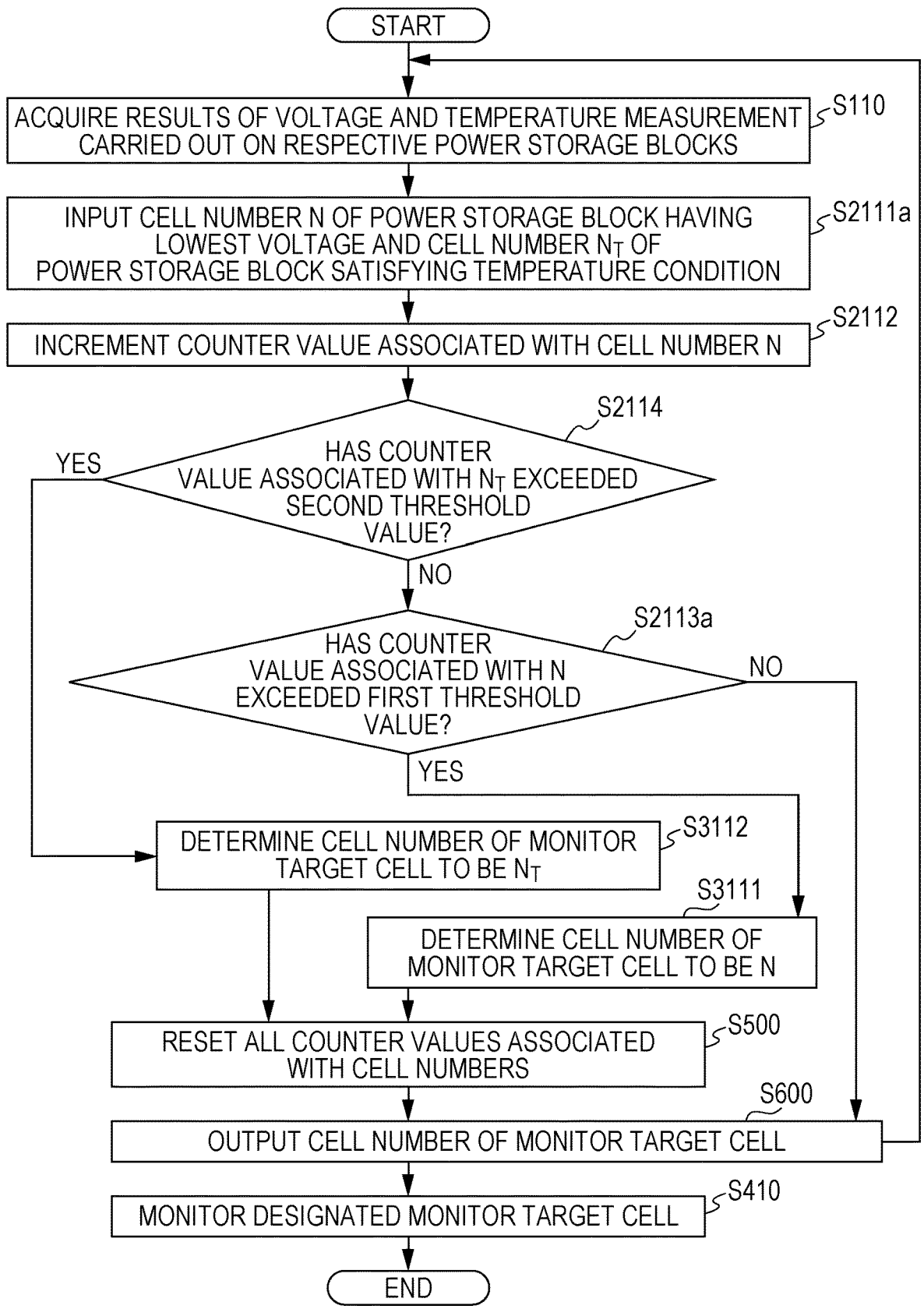
FIG. 15 is a flowchart showing a second example operation of the power storage member monitoring device according to the third modification of the third embodiment of the present disclosure.

FIG. 15 is a flowchart showing a second example operation of the power storage apparatus 100 of this modification. This example operation is an embodiment of a power storage member monitoring method according to the present disclosure. The subject of this example operation may also be either of the first example structure shown in FIG. 12 and the second example structure shown in FIG. 13, or some other structure.

In this example operation, the order of step 2113a (S2113a) and step 2114 (S2114) differs from that in the first example operation.

Specifically, in this example operation, step 2114 (S2114) is carried out immediately after step 2112 (S2112). In a case where a positive determination result is obtained in step 2114 (S2114), the operation moves on to step 3112 (S3112). In a case where a negative determination result is obtained in step 2114 (S2114), the operation moves on to step 2113a (S2113a). In a case where a positive determination result is obtained in step 2113a (S2113a), the operation moves on to step 3111 (S3111). In a case where a negative determination result is obtained in step 2113a (S2113a), the operation returns to step 110 (S110) via step 600 (S600). In this example operation, a monitor target cell can be promptly designated if there is a cell of the second power storage block.

With the power storage apparatus 100 of this modification, the same effects as those of the power storage apparatus 100 described above with reference to FIG. 11 can be achieved. Also, in the power storage apparatus 100 of this modification, the temperature conditions are also used in designating a monitor target cell, with the temperature dependence of the degradation level of each cell 1110 being taken into account. Accordingly, the certainty of monitoring of each cell 1110 having a high degradation level can be further increased.

9. Fourth Modification of the Third Embodiment

Example Structure of an Apparatus

In a power storage apparatus 100 of this modification, a circuit 121 has an even more particular structure than that of the power storage apparatus 100 described above with reference to FIGS. 12 and 13.

Specifically, in the power storage apparatus 100 of this modification, the circuit 121 is designed to designate a second power storage block that is the power storage block 110 that has the lowest voltage a larger number of times than a second threshold value and has the lowest temperature that is lower than a threshold temperature.

[Example Operation of the Apparatus]

Figure 16:
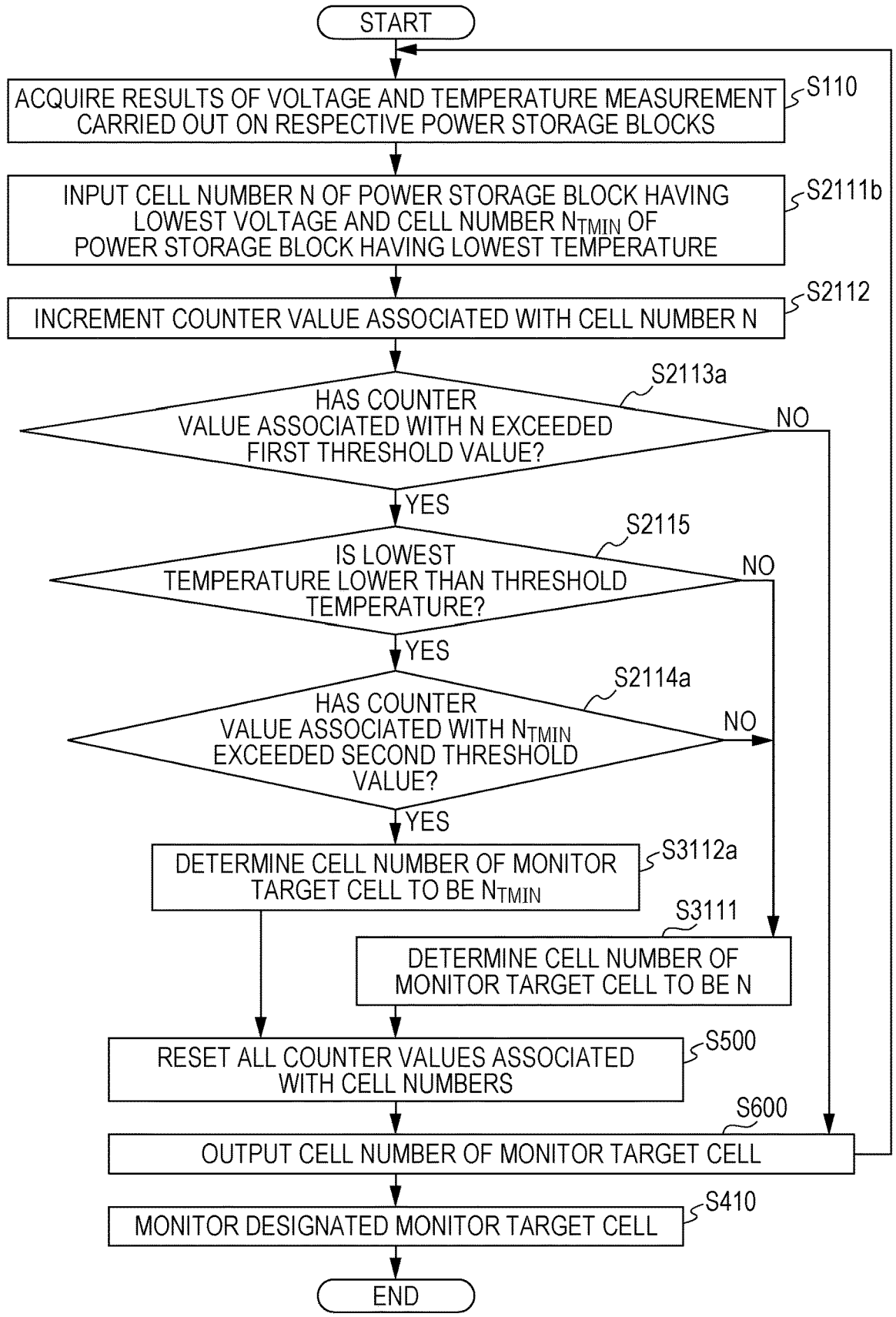
FIG. 16 is a flowchart showing an example operation of a power storage member monitoring device according to a fourth modification of the third embodiment of the present disclosure.

FIG. 16 is a flowchart showing an example operation of the power storage apparatus 100 of this modification. The example operation shown in FIG. 16 is an embodiment of a power storage member monitoring method according to the present disclosure.

The power storage apparatus 100 of this modification carries out step 2111b (S2111b) of FIG. 16 as a specific example of step 2111a (S2111a) of FIG. 14. The power storage apparatus 100 of this modification carries out step 2114a (S2114a) of FIG. 16 as a specific example of step 2114 (S2114) of FIG. 14. The power storage apparatus 100 of this modification carries out step 2115 (S2115) of FIG. 16 between step 2113a (S2113a) and step 2114a (S2114a), which have been described with reference to FIG. 14. The power storage apparatus 100 of this modification carries out step 3112a (S3112a) of FIG. 16 as a more specific example of step 3112 (S3112) of FIG. 14.

Specifically, in step 2111b (S2111b), the circuit 121 inputs the cell number N of the power storage block 110 having the lowest voltage to the determining block of the circuit 121 based on the voltage measurement results acquired in step 110 (S110), as shown in FIG. 16. In step 2111b (S2111b), the circuit 121 also inputs the cell number ($N_{TMIN}$, for example) of the power storage block 110 having the lowest temperature to the determining block of the circuit 121 based on the temperature measurement results acquired in step 110 (S110).

In step 2115 (S2115), the determining block of the circuit 121 determines whether the lowest temperature of the power storage block 110 is lower than the threshold temperature. In a case where a positive determination result is obtained, the operation moves on to step 2114a (S2114a). In a case where a negative determination result is obtained, the operation moves on to step 3111 (S3111).

In step 2114a (S2114a), the determining block of the circuit 121 determines whether the counter value associated with the cell number $N_{TMIN}$ has exceeded the second threshold value. In a case where $N_{TMIN}$ is equal to N, the counter value associated with the cell number $N_{TMIN}$ is the value incremented in step 2112 (S2112) in the current determination cycle. In a case where NTNIN is not equal to N, the counter value associated with the cell number $N_{TMIN}$ may be the value incremented in step 2112 (S2112) in the previous or earlier determination cycle. In a case where a positive determination result is obtained in step 2114a (S2114a), the operation moves on to step 3112a (S3112a). In a case where a negative determination result is obtained in step 2114a (S2114a), the operation moves on to step 3111 (S3111).

In step 3112a (S3112a), the determining block of the circuit 121 determines the cell number $N_{TMIN}$ to be the cell number of the monitor target cell.

With the power storage apparatus 100 of this modification, the same effects as those of the power storage apparatus 100 described above with reference to FIGS. 12 and 13 can be achieved. Also, with the power storage apparatus 100 of this modification, the certainty of monitoring of a cell 1110 having a high degradation level can be further increased. The internal resistance of a cell has non-linear temperature dependence, and tends to rapidly increase at lower temperatures. Particularly, in a large-sized power storage apparatus, internal resistances tend to have large differences due to variation in temperature distribution that depends on positions of the cells. In view of this, according to this modification, a cell 1110 exhibiting a large increase in internal resistance due to temperature dependence can be monitored with high certainty.

In step 2115 (S2115), an instantaneous value, instead of a counter value, is used as the lowest temperature. This is because a temperature change is slow in terms of time and is not as rapid as a voltage change, and the cell currently having the lowest temperature can be identified from temperature instantaneous values. However, a counter that counts the number of times the lowest temperature is observed may be prepared for each of the power storage blocks 110, and the second power storage block may be determined based on the threshold value of the counter, as in the case where a counter that counts the number times the lowest voltage is observed is prepared for each power storage block 110.

10. Fifth Modification of the Third Embodiment

Example Structure of an Apparatus

In a power storage apparatus 100 of this modification, a circuit 121 has a more particular structure than that of the power storage apparatus 100 described above with reference to FIG. 16.

Specifically, in the power storage apparatus 100 of this modification, the circuit 121 is designed to designate monitor target cells that are a cell of the first power storage block and a cell of the second storage block described above with reference to FIG. 16.

[Example Operation of the Apparatus]

Figure 17:
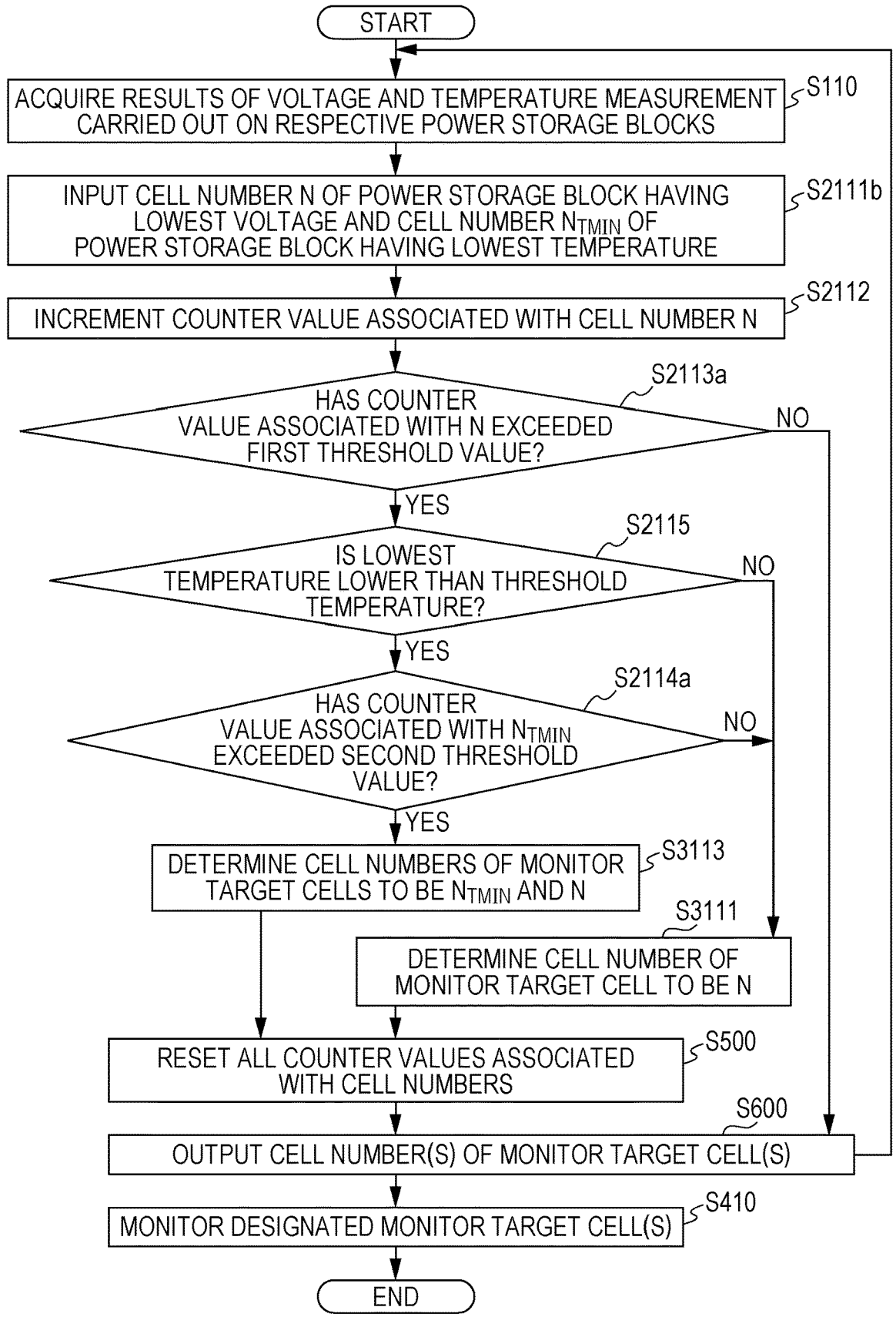
FIG. 17 is a flowchart showing an example operation of a power storage member monitoring device according to a fifth modification of the third embodiment of the present disclosure.

FIG. 17 is a flowchart showing an example operation of the power storage apparatus 100 of this modification. The example operation shown in FIG. 17 is an embodiment of a power storage member monitoring method according to the present disclosure.

The power storage apparatus 100 of this modification carries out step 3113 (S3113), instead of step 3112a (S3112a) of FIG. 16. Specifically, in step 3113 (S3113), the determining block of the circuit 121 determines the cell numbers of the monitor target cells to be the cell number $N_{TMIN}$ and the cell number N ($\Box N_{TMIN}$), as shown in FIG. 17.

With the power storage apparatus 100 of this modification, the same effects as those of the power storage apparatus 100 described above with reference to FIG. 16 can be achieved, and the number of monitor targets can be within a necessary limit while the opportunities to monitor a target having a high degradation level is increased.

11. Sixth Modification of the Third Embodiment

Example Structure of an Apparatus

In a power storage apparatus 100 of this modification, a circuit 121 has a more particular structure than that of the power storage apparatus 100 described above with reference to FIG. 11.

Specifically, in the power storage apparatus 100 of this modification, the circuit 121 is designed to designate a monitor target cell that is a cell of a power storage block that has the lowest voltage a relatively large number of times in a certain period of time, every time the certain period of time has passed.

[Example Operation of the Apparatus]

Figure 18:
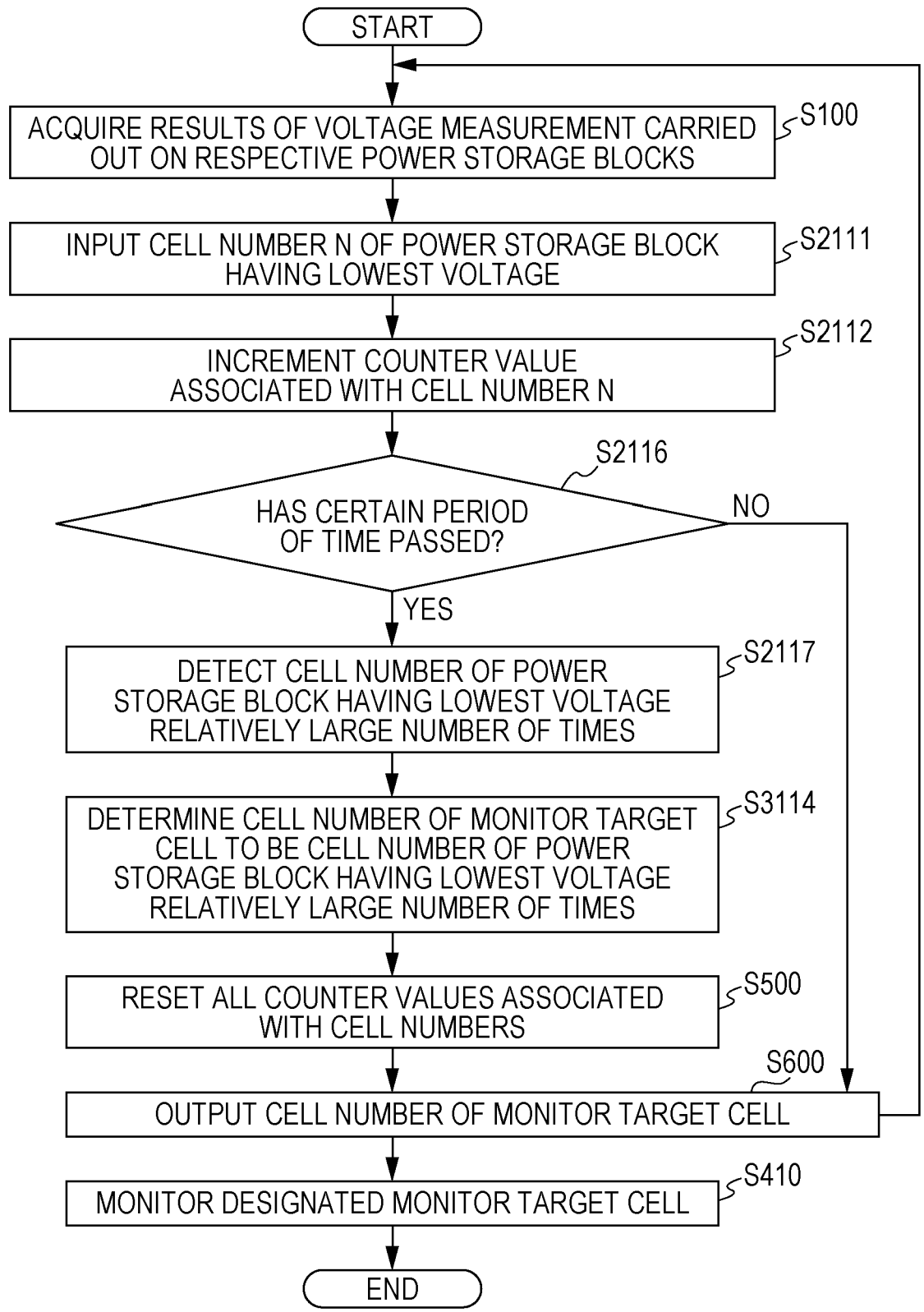
FIG. 18 is a flowchart showing an example operation of a power storage member monitoring device according to a sixth modification of the third embodiment of the present disclosure.

FIG. 18 is a flowchart showing an example operation of the power storage apparatus 100 of this modification. The example operation shown in FIG. 18 is an embodiment of a power storage member monitoring method according to the present disclosure.

The power storage apparatus 100 of this modification carries out steps 2116 (S2116) and 2117 (S2117) of FIG. 18, instead of step 2113 (S2113) of FIG. 11. The power storage apparatus 100 of this modification carries out step 3114 (S3114), instead of step 3111 (S3111) of FIG. 11.

Specifically, in step 2116 (S2116), the determining block of the circuit 121 determines whether the certain period of time has passed. The certain period of time is measured from the point of time at which the monitoring of the current monitor target cell was started, but is not limited to that. In a case where a positive determination result is obtained in step 2116 (S2116), the operation moves on to step 2117 (S2117). In a case where a negative determination result is obtained in step 2116 (S2116), the operation returns to step 100 (S100) via step 600 (S600).

In step 2117 (S2117), the determining block of the circuit 121 detects the cell number of the power storage block 110 that has the lowest voltage a relatively large number of times in the certain period of time.

In step 3114 (S3114), the determining block of the circuit 121 determines the cell number detected in step 2117 (S2117) to be the cell number of the monitor target cell.

With the power storage apparatus 100 of this modification, the same effects as those of the power storage apparatus 100 shown in FIG. 11 can be achieved, or monitor target cells can be changed in accordance with voltage changes that occur in a short period of time, as selection of a monitor target cell can be revised every time a certain period of time has passed.

12. Seventh Modification of the Third Embodiment

Example Structure of an Apparatus

In a power storage apparatus 100 of this modification, a circuit 121 has an even more particular structure than that of the power storage apparatus 100 described above with reference to FIG. 18.

Specifically, the circuit 121 of this modification is designed to designate a monitor target cell that is a cell of the power storage block that has the lowest voltage the largest number of times in a certain period of time when the discharge capacity exceeds a threshold capacity. The circuit 121 of this modification is also designed to designate a monitor target cell that is a cell of a power storage block that has the lowest voltage a larger number of times than a threshold value when the discharge capacity is equal to or lower than the threshold capacity. The threshold capacity may be a threshold value for the capacity of an entire power storage block 110, or may be a threshold value for the capacity of one or more representative cells. The data of the threshold capacity may be stored in the storage area of the circuit 121 or the storage area of an external storage device that can be read by the circuit 121. The circuit 121 may be designed to calculate the current discharge capacity by adding the product of the value of current data and the time elapsing from the previous acquirement of current data to the previously calculated discharge capacity, for example. The current discharge capacity may be the discharge capacity of an entire power storage block 110, or may be the discharge capacity of one or more representative cells. The circuit 121 may be designed to compare the current discharge capacity with the threshold capacity. The comparison may be performed by a comparator or the like included in the circuit 121, but may be performed in some other manner.

[Example Operation of the Apparatus]

An example operation of the power storage apparatus 100 of this modification described below is an embodiment of a power storage member monitoring method according to the present disclosure.

[Example of Threshold Capacity Setting]

Figure 19:
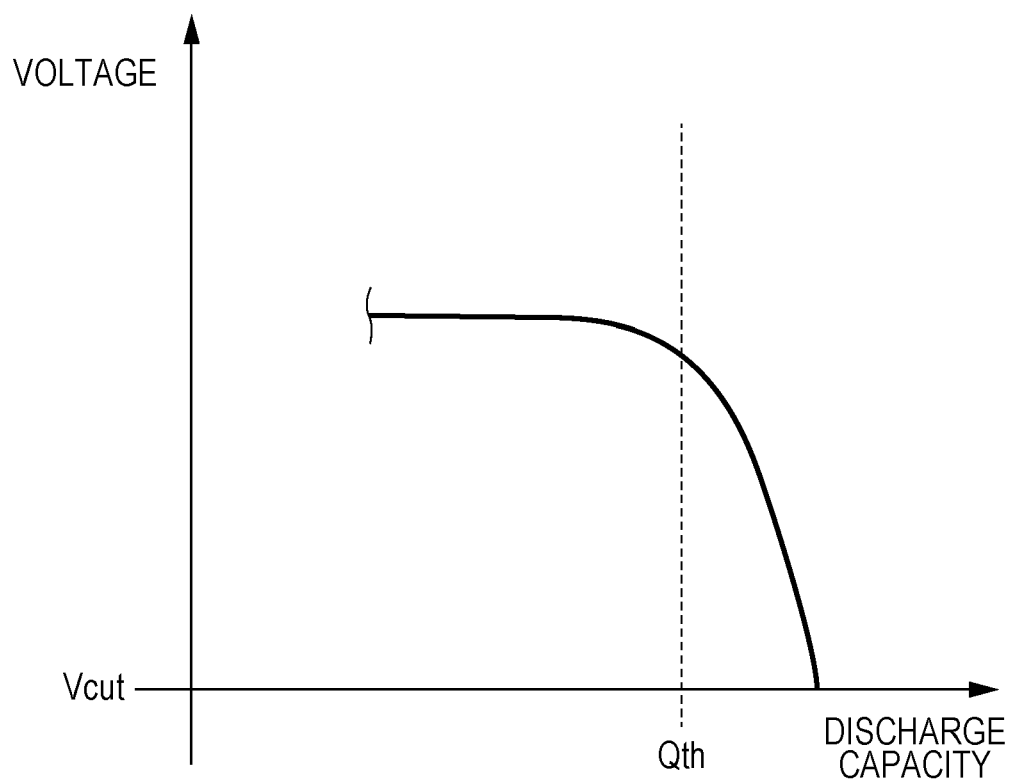
FIG. 19 is a graph showing a discharge characteristics curve for explaining an example operation of a power storage member monitoring device according to a seventh modification of the third embodiment of the present disclosure.

The threshold capacity is not limited to any specific form, but a threshold capacity Qth as a preferred example of the threshold capacity may be the capacity corresponding to the point at which the voltage drop starts becoming rapid in the vicinity of the discharge cutoff on a discharge characteristics curve that is drawn on a graph where the abscissa axis indicates discharge capacity while the ordinate axis indicates voltage, as shown in FIG. 19. In this case, in a high SOC (state of charge) area where the voltage change is small, a monitor target cell can be designated based on the threshold value for the number of times the lowest voltage is observed. In a low SOC area where the voltage change is large, a monitor target cell can be designated based on the largest number of times the lowest voltage is observed in a certain period of time.

[Flowchart]

Figure 20:
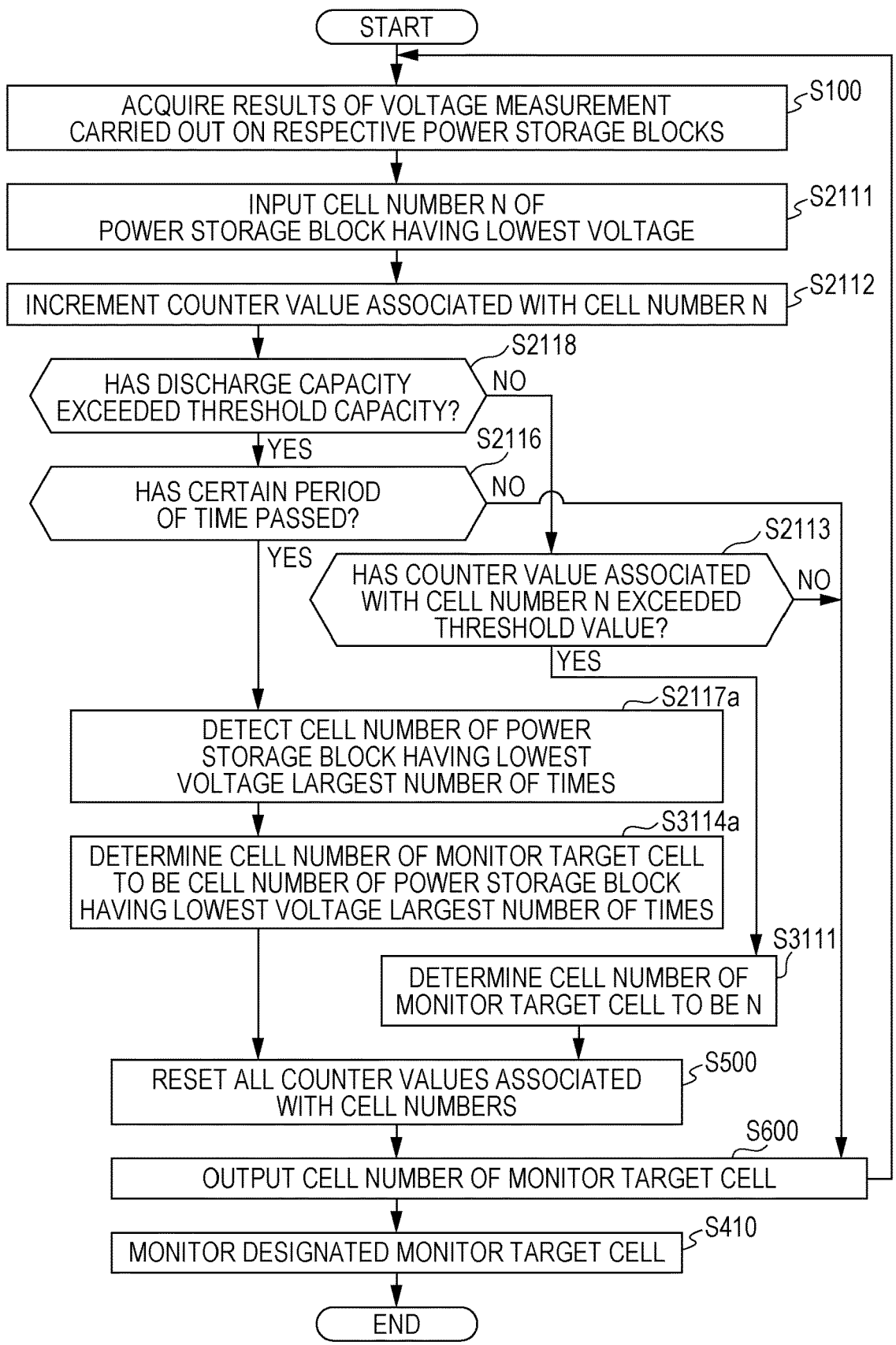
FIG. 20 is a flowchart showing an example operation of the power storage member monitoring device according to the seventh modification of the third embodiment of the present disclosure.

FIG. 20 is a flowchart showing an example operation of the power storage apparatus 100 of this modification. The power storage apparatus 100 of this modification carries out step 2118 (S2118) of FIG. 20 between step 2112 (S2112) and step 2116 (S2116), which have been described with reference to FIG. 18. The power storage apparatus 100 of this modification carries out steps 2113 (S2113) and 3111 (S3111), which have been described with reference to FIG. 11, between step 2118 (S2118) and step 500 (S500). The power storage apparatus 100 of this modification carries out step 2117*a* (S2117*a*) of FIG. 20 as a specific example of step 2117 (S2117), which has been described with reference to FIG. 18. The power storage apparatus 100 of this modification carries out step 3114*a* (S3114*a*) of FIG. 20 as a specific example of step 3114 (S3114), which has been described with reference to FIG. 18.

Specifically, in step 2118 (S2118), the determining block of the circuit 121 determines whether the current discharge capacity has exceeded the threshold capacity. In a case where a positive determination result is obtained, the operation moves on to step 2116 (S2116). In a case where a negative determination result is obtained, the operation moves on to step 2113 (S2113). In step 2117*a* (S2117*a*), the determining block of the circuit 121 detects the cell number of the power storage block 110 that has the lowest voltage the largest number of times in the certain period of time. In step 3114*a* (S3114*a*), the determining block of the circuit 121 determines the cell number detected in step 2117*a* (S2117*a*) to be the cell number of the monitor target cell.

With the power storage apparatus 100 of this modification, the same effects as those of the power storage apparatus 100 shown in FIG. 18 can be achieved, or a preferred method of designating a monitor target cell can be selected in accordance with discharge capacity. For example, a monitor target cell can be accurately monitored without frequent switching of monitor target cells in a high SOC area where the voltage change is small, and a cell having a rapid voltage drop can be designated as a monitor target cell in a short period of time in a low SOC area.

13. Fourth Embodiment

Example Structure of an Apparatus

In a power storage apparatus 100 of this embodiment, a circuit 121 has a more particular structure than that of the power storage apparatus 100 of the third embodiment.

Specifically, the circuit 121 of this embodiment is designed to designate a monitor target cell based on the voltage at a time of discharging of each power storage block 110.

[Example Operation of the Apparatus]

An example operation of the power storage apparatus 100 of this embodiment described below is an embodiment of a power storage member monitoring method according to the present disclosure.

[Advantages of Using Voltage at Time of Discharging]

Figure 21:
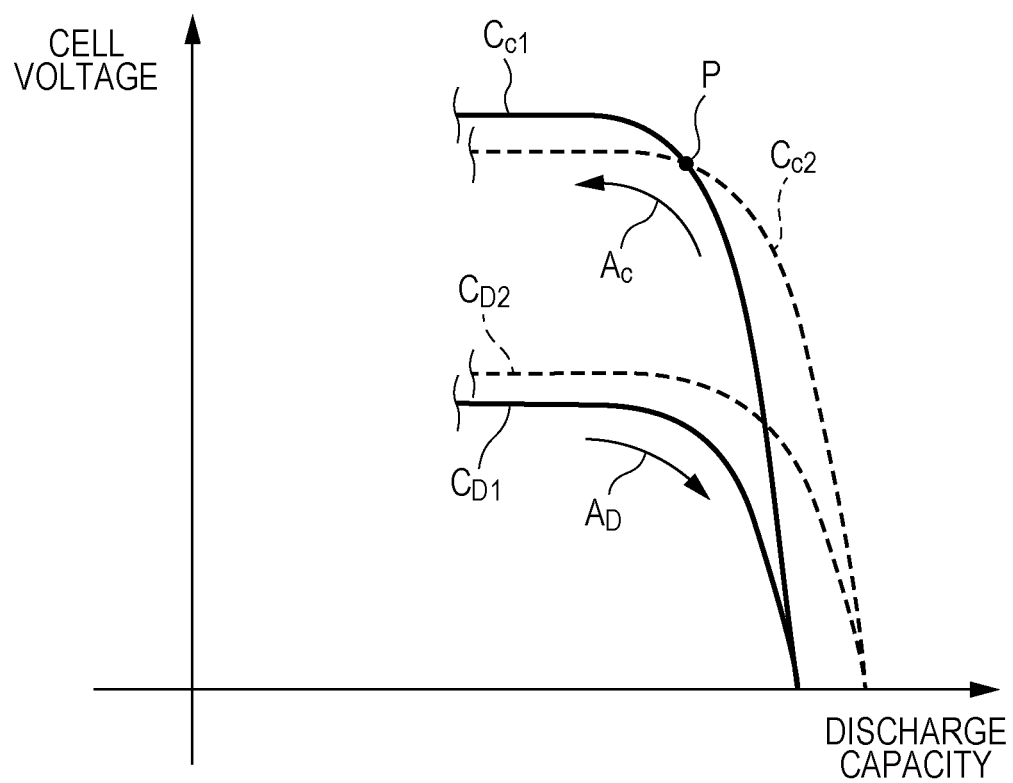
FIG. 21 is a graph showing charge and discharge curves for explaining an example operation of a power storage member monitoring device according to a fourth embodiment of the present disclosure.

FIG. 21 shows charge and discharge curves of degraded cells, with the abscissa axis indicating discharge capacity, the ordinate axis indicating voltage. Specifically, FIG. 21 shows discharge curves $C_{D1}$ and $C_{D2}$ in the vicinity of the discharge cutoff in a case where discharging is performed with a certain amount of current. More specifically, the first discharge curve $C_{D1}$ that is a solid line is the discharge curve of the most degraded cell having the highest internal resistance, and the second discharge curve $C_{D2}$ that is a dashed line is the discharge curve of a regular degraded cell. FIG. 21 also shows charge curves $C_{C1}$ and $C_{C2}$ in the vicinity of the discharge cutoff in a case where charging is performed with a certain amount of current. More specifically, the first charge curve $C_{C1}$ that is a solid line is the charge curve of the most degraded cell, and the second charge curve $C_{C2}$ that is a dashed line is the charge curve of a regular degraded cell. The arrow $A_D$ corresponding to the discharge curves $C_{D1}$ and $C_{D2}$ in the drawing indicates the capacity and the direction of the voltage change at the time of discharging. The arrow $A_C$ corresponding to the charge curves $C_{C1}$ and $C_{C2}$ in the drawing indicates the capacity and the direction of the voltage change at the time of charging.

As shown in FIG. 21, during discharging, the first discharge curve $C_{D1}$ constantly exhibits a smaller voltage value than the second discharge curve $C_{D2}$. Where the discharge capacity at the discharge cutoff voltage is the battery capacity, the battery capacity becomes smaller as the degradation or the internal resistance becomes larger. During charging, on the other hand, the first charge curve $C_{C1}$ exhibits a smaller voltage value than the second charge curve $C_{C2}$ in a region where the voltage change is large in the vicinity of the discharge cutoff. However, at point P where the charging progresses to a certain degree, the relationship between the voltage values of both curves $C_{C1}$ and $C_{C2}$ is reversed. Therefore, in the vicinity of the discharge cutoff, for example, it might be difficult to appropriately identify a cell having a high degradation level based only on the relationship between voltage values. Where voltages at a time of discharging are used, on the other hand, a small voltage value faithfully reflects a high degradation level. Accordingly, a monitor target cell can be readily and appropriately designated.

[Flowchart]

Figure 22:
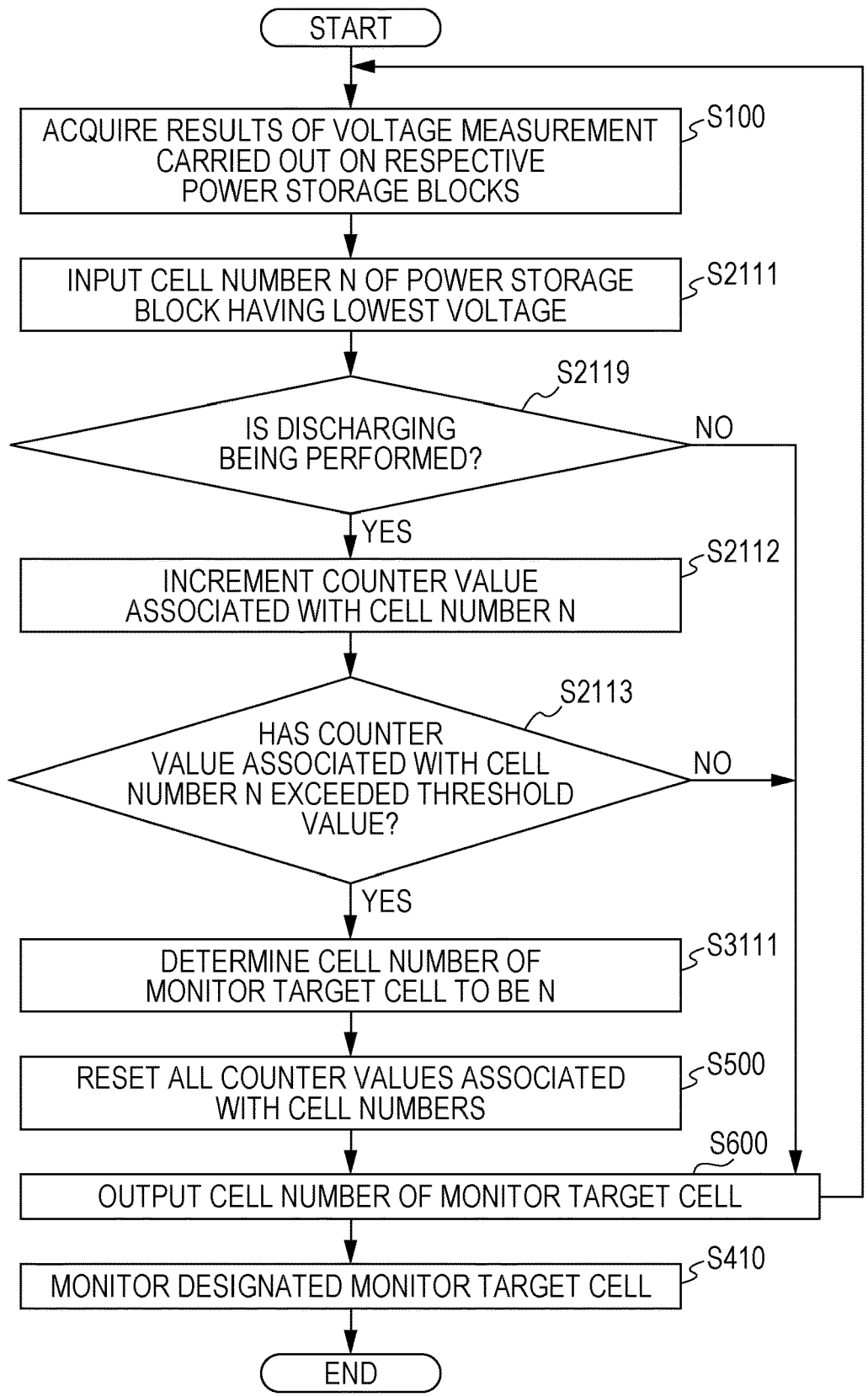
FIG. 22 is a flowchart showing an example operation of the power storage member monitoring device according to the fourth embodiment of the present disclosure.

FIG. 22 is a flowchart showing an example operation of the power storage apparatus 100 of this embodiment. The power storage apparatus 100 of this embodiment carries out step 2119 (S2119) between step 2111 (S2111) and step 2112 (S2112), which have been described with reference to FIG. 11.

Specifically, in step 2119 (S2119), the determining block of the circuit 121 determines whether discharging is being performed. In a case where a positive determination result is obtained, the operation moves on to step 2112 (S2112). In a case where a negative determination result is obtained, the operation returns to step 100 (S100) via step 600 (S600).

With the power storage apparatus 100 of this embodiment, the same effects as those of the power storage apparatus 100 of the third embodiment can be achieved, or the certainty of determining a monitor target cell that is a cell 1110 having a high degradation level can be further increased by using voltages at a time of discharging.

The cell 1110 having the lowest voltage or the cell number during discharging may be determined simply by detecting the cell 1110 that has the lowest voltage when a predetermined current value is measured. In a case where the power storage apparatus 100 includes a circuit for voltage equalization or cell balancing, discharging of each cell during a cell balancing process may not be regarded as discharging in step 2119 (S2119). In the vicinity of full charge, the voltage drop during discharging of a cell due to the cell balancing process is large, and therefore, the discharging is recognized. Also, only when the cell has a lower voltage than a threshold voltage, may the cell be determined to be the cell having the lowest voltage.

14. Fifth Embodiment

In a power storage apparatus 100 of this embodiment, a circuit 121 has a more particular structure than that of the power storage apparatus 100 of the first embodiment.

Specifically, in the power storage apparatus 100 of this embodiment, the circuit 121 is designed to designate a monitor target cell based on results of voltage measurement carried out more than once, the results being acquired through communication.

Figure 23:
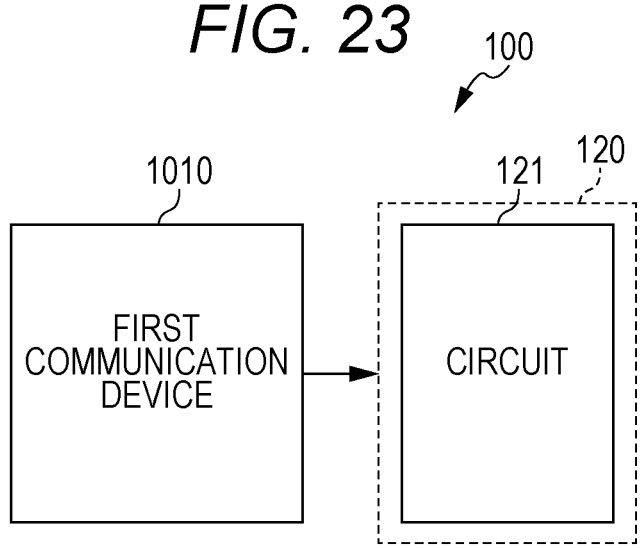
FIG. 23 is a diagram schematically showing an example structure of a power storage member monitoring device according to a fifth embodiment of the present disclosure.

FIG. 23 shows a more specific example structure. As shown in FIG. 23, the power storage apparatus 100 includes a first communication device 1010 connected to a power storage member monitoring device 120. The circuit 121 receives results of voltage measurement carried out on power storage blocks 110 through data communication via the first communication device 1010. The circuit 121 then designates a monitor target power storage member based on the received results of the voltage measurement carried out more than once. In this embodiment, the circuit 121 may receive measurement results other than voltage measurement results, such as results of current measurement and temperature measurement carried out on power storage members 111.

The circuit 121 may be placed in a position separated from the power storage blocks 110. The circuit 121 may be connected to the provider of results of measurement carried out on the power storage blocks 110 through communication via a network.

The network may be an external network or the like. The external network may be the Internet or the like. The circuit 121 may be a server or the like on the Internet. The method used by the circuit 121 to receive voltage measurement results is not limited to any specific method, and the circuit 121 of a power storage member monitoring device 120 according to the present disclosure may receive voltage measurement results through any kinds of route. The communication method used by the first communication device 1010 is not limited to any specific method either, and any kind of communication device that can communicate with the provider may be used. The first communication device 1010 may be included in the power storage member monitoring device 120 or in the circuit 121.

The provider of voltage measurement results may be a communication device placed on the side of the power storage blocks 110, or may be a computer or the like that has acquired information about the voltage measurement results in the network. However, the provider is not limited to any of the above. The trigger for establishment of a communication connection is not particularly limited, either. For example, the circuit 121 may request voltage measurement results from the provider, and the provider may respond to the request. Alternatively, the provider may constantly or regularly transmit voltage measurement results to the circuit 121.

[Example Operation of the Apparatus]

Figure 24:
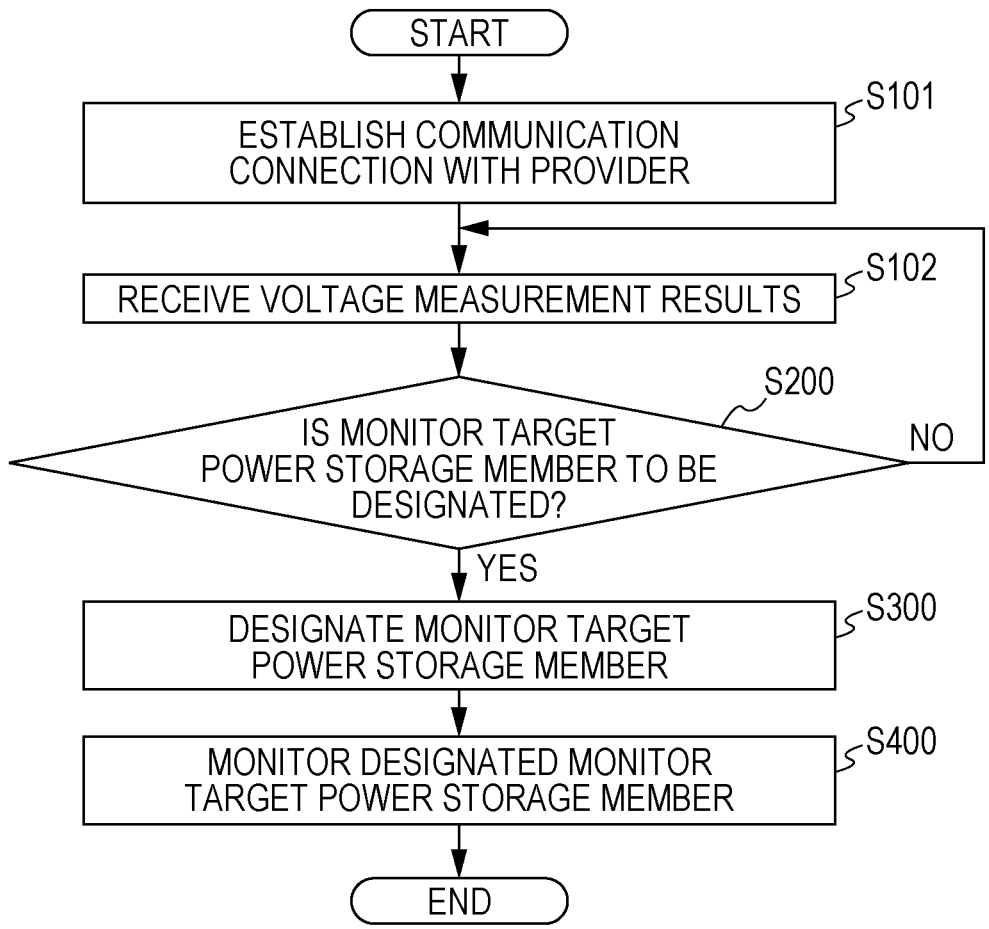
FIG. 24 is a flowchart showing an example operation of the power storage member monitoring device according to the fifth embodiment of the present disclosure.

FIG. 24 is a flowchart showing an example operation of the power storage apparatus 100 of this embodiment. The example operation shown in FIG. 24 is an embodiment of a power storage member monitoring method according to the present disclosure.

In this embodiment, steps 101 (S101) and 102 (S102) are carried out as a specific example of step 100 (S100) of FIG. 2.

Specifically, in step 101 (S101), the first communication device 1010 establishes a communication connection with the provider of voltage measurement results.

In step 102 (S102), the circuit 121 receives voltage measurement results from the provider through communication performed by the first communication device 1010.

In this embodiment, if the determination result of step 200 (S200) is negative, the operation returns to step 102 (S102).

According to this embodiment, the same effects as those of the first embodiment can be achieved, or a monitor target power storage member can be designated by the single circuit 121 with respect to cells 1110 that are located in various places.

15. First Modification of the Fifth Embodiment

Example Structure of an Apparatus

In a power storage apparatus 100 of this modification, the structure on the side of power storage blocks 110 is more particular than that of the power storage apparatus 100 described above with reference to FIG. 23.

Figure 25:
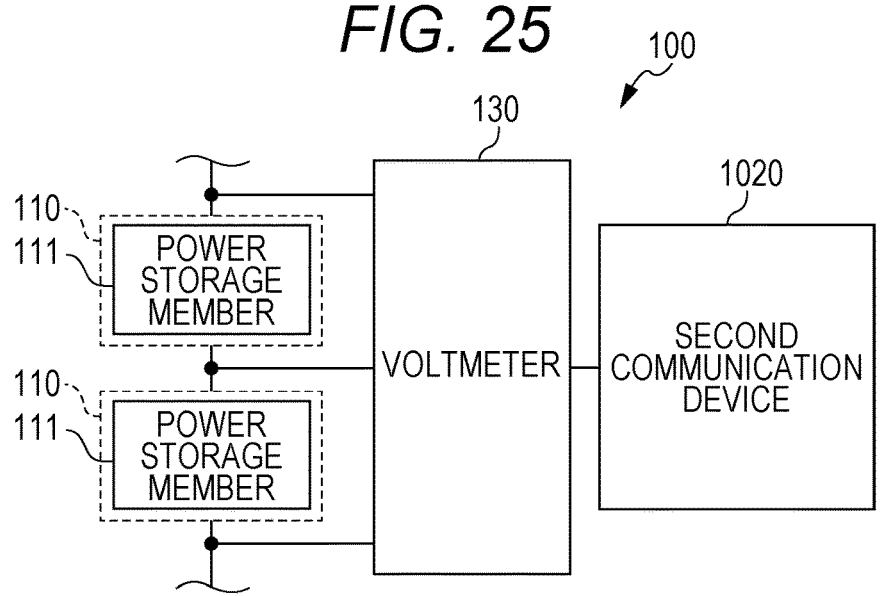
FIG. 25 is a diagram schematically showing an example structure of a power storage member monitoring device according to a first modification of the fifth embodiment of the present disclosure.

Specifically, the power storage apparatus 100 of this modification includes a second communication device 1020 connected to a voltmeter 130, as shown in FIG. 25.

The second communication device 1020 is designed to transmit voltage measurement results input from the voltmeter 130 to a circuit 121. The second communication device 1020 is not limited to any specific form. In this modification, when a measurement device other than the voltmeter 130, such as an ammeter or a thermometer, is connected to the power storage blocks 110, the second communication device 1020 may transmit measurement results from the measurement device to the circuit 121.

[Example Operation of the Apparatus]

Figure 26:
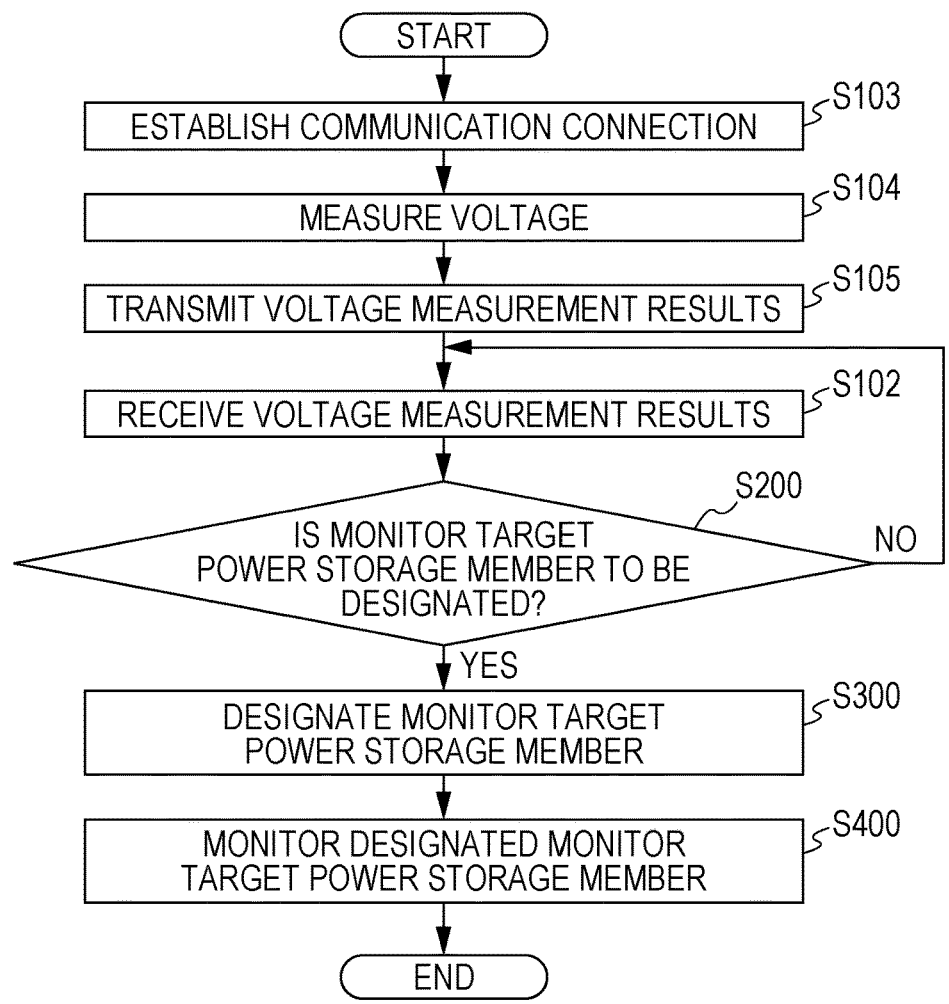
FIG. 26 is a flowchart showing an example operation of the power storage member monitoring device according to the first modification of the fifth embodiment of the present disclosure.

FIG. 26 is a flowchart showing an example operation of the power storage apparatus 100 of this modification. The example operation shown in FIG. 26 includes an embodiment of a power storage member monitoring method according to the present disclosure.

In step 103 (S103) in FIG. 26, the second communication device 1020 first establishes a communication connection with the first communication device 1010.

In step 104 (S104), the voltmeter 130 measures voltages of the power storage blocks 110, and outputs measurement results to the second communication device 1020.

In step 105 (S105), the second communication device 1020 transmits the voltage measurement results to the side of the circuit 121. The operation then moves on to step 102 (S102) described above with reference to FIG. 24.

According to this modification, the same effects as those of the first embodiment can be achieved, or costs can be lowered as there is no need to prepare a circuit 121 for each group of series-connected power storage blocks 110.

The above described embodiments and modifications may be combined in an appropriate fashion. Adding a component of an embodiment or modification to another embodiment or modification, and replacing a component of an embodiment or modification with a component of another embodiment or modification are within the scope of the present disclosure.

For example, the selection of a method of designating a monitor target cell based on a threshold value for discharge capacity as described above with reference to FIG. 20 may be combined with any of the power storage apparatuses 100 described above with reference to FIGS. 14 through 17. In this case, step 2118 (S2118) of FIG. 20 may be carried out immediately after step 2112 (S2112) of FIGS. 14 through 17. In a case where a positive determination result is obtained in step 2118 (S2118), the operation may move on to step 2116 (S2116) of FIG. 20. In a case where a negative determination result is obtained in step 2118 (S2118), on the other hand, the operation may move on to step 2113a (S2113a) of FIG. 14, 16, or 17, or to step 2114 (S2114) of FIG. 15.

Also, the designation of a monitor target cell based on voltages at a time of discharging as described above with reference to FIG. 22 may be combined with any of the power storage apparatuses 100 described above with reference to FIGS. 14 through 17. In this case, step 2119 (S2119) of FIG. 22 may be carried out immediately after step 2111a (S2111a) of FIG. 14 or 15, or step 2111b (S2111b) of FIG. 16 or 17. In a case where a positive determination result is obtained in step 2119 (S2119), the operation may move on to step 2112 (S2112) of any of FIGS. 14 through 17. In a case where a negative determination result is obtained in step 2119 (S2119), the operation may return to step 110 (S110) of any of FIGS. 14 through 17 via step 600 (S600) of any of FIGS. 14 through 17.

Further, in the power storage apparatus 100 of the fifth embodiment, current measurement results and temperature measurement results may be added to the measurement results acquired through communication, so that the circuit 121 designates a monitor target cell by taking into account the internal resistance calculation and the temperature conditions.

Also, step 2115 (S2115) may be removed from FIG. 16, so that the only temperature condition for the second power storage block is to have the lowest temperature.

In the modifications of the first embodiment, and in the second through fifth embodiments, power storage members 111 that are not formed with cells 1110 may be used.

The effects described in the respective embodiments and modifications are merely examples and are not particularly limited, and there may be other effects. The present disclosure is to achieve at least one of the effects described above in the respective embodiments and modifications.

The present disclosure may also be embodied in the structures described below.

(1) A power storage member monitoring device including a circuit that designates a monitor target power storage member based on results of voltage measurement carried out more than once on each of series-connected power storage blocks, each of the power storage blocks including at least one power storage member.

(2) The power storage member monitoring device of (1), wherein the circuit designates the monitor target power storage member that is a power storage member of a power storage block having the lowest voltage at a relatively high frequency among the power storage blocks.

(3) The power storage member monitoring device of (2), wherein the circuit designates the monitor target power storage member that is a power storage member of a power storage block having the lowest voltage a relatively large number of times among the power storage blocks.

(4) The power storage member monitoring device of (3), wherein the circuit designates the monitor target power storage member that is a power storage member of a power storage block having the lowest voltage a larger number of times than a threshold value.

(5) The power storage member monitoring device of (4), wherein the circuit designates the monitor target power storage member that is a power storage member of a second power storage block, the second power storage block having the lowest voltage a larger number of times than a second threshold value and satisfying a temperature condition, the second threshold value being smaller than a first threshold value.

(6) The power storage member monitoring device of (5), wherein, when the second power storage block does not exist, the circuit designates the monitor target power storage member that is a power storage member of a first power storage block having the lowest voltage a larger number of times than the first threshold value.

(7) The power storage member monitoring device of (5), wherein the circuit designates monitor target power storage members that are a power storage member of a first power storage block having the lowest voltage a larger number of times than the first threshold value, and a power storage member of the second power storage block.

(8) The power storage member monitoring device of any of (5) through (7), wherein the temperature condition includes having the lowest temperature.

(9) The power storage member monitoring device of (8), wherein the temperature condition includes having a lower temperature than a threshold temperature.

(10) The power storage member monitoring device of (3), wherein the circuit designates the monitor target power storage member that is a power storage member of a power storage block having the lowest voltage a relatively large number of times in a certain period of time every time the certain period of time has passed.

(11) The power storage member monitoring device of (10), wherein, when a discharge capacity exceeds a threshold capacity, the circuit designates the monitor target power storage member that is a power storage member of the power storage block having the lowest voltage the largest number of times in the certain period of time, and, when the discharge capacity is equal to or lower than the threshold capacity, the circuit designates the monitor target power storage member that is a power storage member of a power storage block having the lowest voltage a larger number of times than a threshold value.

(12) The power storage member monitoring device of any of (1) through (11), wherein the circuit designates the monitor target power storage member based on the results of the voltage measurement carried out more than once, the results being acquired through communication.

(13) The power storage member monitoring device of any of (1) through (12), wherein the circuit designates the monitor target power storage member based on voltages of the respective power storage blocks at a time of discharging.

(14) The power storage member monitoring device of any of (1) through (13), wherein the circuit calculates an internal resistance of the monitor target power storage member.

(15) A power storage member monitoring program for causing a computer to function as a means to designate a monitor target power storage member based on results of voltage measurement carried out more than once on each of series-connected power storage blocks, each of the power storage blocks including at least one power storage member.

REFERENCE SIGNS LIST

100 Power storage apparatus
110 Power storage block
111 Power storage member
120 Power storage member monitoring device
121 Circuit It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A power storage member monitoring method comprising:
designating a monitor target power storage member to be monitored from a plurality of power storage members based on results of voltage and temperature measurements carried out a plurality of times on each of series-connected power storage blocks, each of the power storage blocks including at least one power storage member; and
incrementing a respective counter value associated with a respective power storage block in response to a voltage measurement of the respective power storage block being the lowest voltage measurement of the series-connected power storage blocks,
wherein designating the monitor target power storage member includes: (i) identifying a first power storage block having a lowest respective voltage measurement of the series-connected power storage blocks, (ii) identifying a second power storage block satisfying a temperature condition, (iii) determining whether a first counter value of the first power storage block exceeds a first threshold value, the first counter value being a quantity of instances in which a voltage measurement of the first power storage block is the lowest voltage measurement of the series-connected power storage blocks, and (iv) determining whether a second counter value of the second power storage block exceeds a second threshold value, the second counter value being a quantity of instances in which a voltage measurement of the second power storage block is the lowest voltage measurement of the series-connected power storage blocks, wherein the first threshold value is greater than the second threshold value,
wherein the monitor target power storage member is designated based on at least one of:
(i) the first counter value of the first power storage block exceeding the first threshold value and (ii) the second counter value of the second power storage block exceeding the second threshold value, and
monitoring degradation of the monitor target power storage member during charging and/or discharging of the plurality of power storage members.

2. The power storage member monitoring method according to claim 1, wherein the plurality of power storage members are configured to be charged and discharged, and wherein the voltage measurements are taken at a time of discharge.

3. The power storage member monitoring method according to claim 1, which includes controlling charging and/or discharging of the plurality of power storage members.

4. The power storage member monitoring method according to claim 1, which includes monitoring a degradation level of the monitor target power storage member for a period of time after designating the monitor target power storage member.

5. The power storage member monitoring method according to claim 1, wherein the temperature condition includes having the lowest temperature.

6. A power storage member monitoring device comprising:
a circuit configured to
designate a monitor target power storage member to be monitored from a plurality of power storage members based on results of voltage and temperature measurements carried out a plurality of times on each of series-connected power storage blocks, each of the power storage blocks including at least one power storage member; and
increment a respective counter value associated with a respective power storage block in response to a voltage measurement of the respective power storage block being the lowest voltage measurement of the series-connected power storage blocks,
wherein designating the monitor target power storage member includes: (i) identifying a first power storage block having a lowest voltage measurement of the series-connected power storage blocks, (ii) identifying a second power storage block satisfying a temperature condition, (iii) determining whether a first counter value of the first power storage block exceeds a first threshold value, the first counter value being a quantity of instances in which a voltage measurement of the first power storage block is the lowest voltage measurement of the series-connected power storage blocks, and (iv)

determining whether a second counter value of the second power storage block exceeds a second threshold value, the second counter value being a quantity of instances in which a voltage measurement of the second power storage block is the lowest voltage measurement of the series-connected power storage blocks, wherein the first threshold value is greater than the second threshold value, wherein the monitor target power storage member is designated based on at least one of: (i) the first counter value of the first power storage block exceeding the first threshold value and (ii) the second counter value of the second power storage block exceeding the second threshold value, and monitor degradation of the monitor target power storage member during charging and/or discharging of the plurality of power storage members.

7. The power storage member monitoring device according to claim 6, wherein the temperature condition includes having the lowest temperature.

8. The power storage member monitoring device according to claim 6, wherein the monitor power storage member has a lowest voltage of the power storage members.

9. The power storage member monitoring device according to claim 6, wherein the plurality of power storage members are configured to be charged and discharged, and wherein the voltage measurements are taken at a time of discharge.

10. The power storage member monitoring device according to claim 6, which is configured to control charging and/or discharging of the plurality of power storage members.

11. The power storage member monitoring device according to claim 6, which is configured to monitor a degradation level of the monitor target power storage member for a period of time after designating the monitor target power storage member.

12. A power storage apparatus comprising:
a plurality of series-connected power storage blocks each including at least one power storage member; and
a power storage member monitoring device including a circuit configured to
designate a monitor target power storage member to be monitored from the power storage members of the plurality of series-connected power storage blocks based on results of voltage and temperature measurements carried out a plurality of times on each of the power storage blocks; and
increment a respective counter value associated with a respective power storage block in response to a voltage measurement of the respective power storage block being the lowest voltage measurement of the series-connected power storage blocks, wherein designating the monitor target power storage member includes: (i) identifying a first power storage block having a lowest respective voltage measurement of the series-connected power storage blocks, (ii) identifying a second power storage block satisfying a temperature condition, (iii) determining whether a first counter value of the first power storage block exceeds a first threshold value, the first counter value being a quantity of instances in which a voltage measurement of the first power storage block is the lowest voltage measurement of the series-connected power storage blocks, and (iv) determining whether a second counter value of the second power storage block exceeds a second threshold value, the second counter value being a quantity of instances in which a voltage measurement of the second power storage block is the lowest voltage measurement of the series-connected power storage blocks, wherein the first threshold value is greater than the second threshold value, wherein the monitor target power storage member is designated based on at least one of: (i) the first counter value of the first power storage block exceeding the first threshold value and (ii) the second counter value of the second power storage block exceeding the second threshold value, and monitor degradation of the monitor target power storage member during charging and/or discharging of the plurality of power storage members.

13. The power storage apparatus according to claim 12, wherein the series-connected power storage blocks are configured to be charged and discharged, and wherein the voltage measurements are taken at a time of discharge.

14. The power storage apparatus according to claim 12, which is configured to control charging and/or discharging of the plurality of series-connected power storage blocks.

15. The power storage apparatus according to claim 12, which is configured to monitor a degradation level of the monitor target power storage member for a period of time after designating the monitor target power storage member.

16. The power storage apparatus according to claim 12, wherein the temperature condition includes having the lowest temperature.

* * * * *